United States Patent
Tsai et al.

(10) Patent No.: US 12,317,570 B2
(45) Date of Patent: *May 27, 2025

(54) PROTECTIVE LINER FOR SOURCE/DRAIN CONTACT TO PREVENT ELECTRICAL BRIDGING WHILE MINIMIZING RESISTANCE

(71) Applicant: Taiwan Semiconductor Manufacturing Company, Ltd., Hsin-Chu (TW)

(72) Inventors: Kuo-Chiang Tsai, Hsinchu (TW); Hsin-Huang Lin, Hsinchu (TW); Jyh-Huei Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/297,892

(22) Filed: Apr. 10, 2023

(65) Prior Publication Data

US 2023/0246083 A1 Aug. 3, 2023

Related U.S. Application Data

(63) Continuation of application No. 17/186,480, filed on Feb. 26, 2021, now Pat. No. 11,626,495.

(51) Int. Cl.
*H10D 64/23* (2025.01)
*H10B 10/00* (2023.01)
(Continued)

(52) U.S. Cl.
CPC ......... *H10D 64/258* (2025.01); *H10B 10/125* (2023.02); *H10D 30/024* (2025.01);
(Continued)

(58) Field of Classification Search
CPC .......... H01L 29/41775; H01L 27/0886; H01L 29/401; H01L 29/41733; H01L 29/41791;
(Continued)

(56) References Cited

U.S. PATENT DOCUMENTS 6,509,267 B1 1/2003 Woo et al.
8,796,666 B1 8/2014 Huang et al.
(Continued)

FOREIGN PATENT DOCUMENTS

JP 2009231497 A 10/2009
KR 20160003539 A 1/2016
(Continued)

*Primary Examiner* — Changhyun Yi
(74) *Attorney, Agent, or Firm* — HAYNES AND BOONE, LLP

(57) ABSTRACT

One or more active region structures each protrude vertically out of a substrate in a vertical direction and each extend horizontally in a first horizontal direction. A source/drain component is disposed over the one or more active region structures in the vertical direction. A source/drain contact is disposed over the source/drain component in the vertical direction. The source/drain contact includes a bottom portion and a top portion. A protective liner is disposed on side surfaces of the top portion of the source/drain contact but not on side surfaces of the bottom portion of the source/drain contact.

20 Claims, 26 Drawing Sheets

(51) Int. Cl.
*H10D 30/01* (2025.01)
*H10D 30/62* (2025.01)
*H10D 30/67* (2025.01)
*H10D 62/10* (2025.01)
*H10D 64/01* (2025.01)
*H10D 84/83* (2025.01)

(52) U.S. Cl.
CPC ......... *H10D 30/62* (2025.01); *H10D 30/6219* (2025.01); *H10D 30/6729* (2025.01); *H10D 30/6735* (2025.01); *H10D 62/118* (2025.01); *H10D 64/01* (2025.01); *H10D 84/834* (2025.01)

(58) Field of Classification Search
CPC ......... H01L 29/42392; H01L 21/76831; H01L 29/66795; H01L 29/785; H01L 29/0665; H10B 10/125; H10D 30/6735; H10D 84/834; H10D 30/6219; H10D 64/01; H10D 30/62
See application file for complete search history.

(56) References Cited

U.S. PATENT DOCUMENTS

| | | |
|---|---|---|
| 8,815,712 B2 | 8/2014 | Wan et al. |
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 8,962,400 B2 | 2/2015 | Tsai et al. |
| 8,963,258 B2 | 2/2015 | Yu et al. |
| 9,093,514 B2 | 7/2015 | Tsai et al. |
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,245,805 B2 | 1/2016 | Yeh et al. |
| 9,520,482 B1 | 12/2016 | Chang et al. |
| 9,548,303 B2 | 1/2017 | Lee et al. |
| 9,576,814 B2 | 2/2017 | Wu et al. |
| 11,626,495 B2 * | 4/2023 | Tsai .................. H01L 29/42392 257/288 |
| 2007/0238295 A1 * | 10/2007 | Alapati ............... H01L 21/0337 257/E21.549 |
| 2009/0236746 A1 | 9/2009 | Kitamura et al. |
| 2011/0221009 A1 | 9/2011 | Chuang |
| 2013/0285116 A1 | 10/2013 | Lochtefeld et al. |
| 2014/0377927 A1 | 12/2014 | Seo et al. |
| 2015/0044846 A1 | 2/2015 | Kerber et al. |
| 2017/0186869 A1 * | 6/2017 | Shin ..................... H01L 29/7833 |
| 2017/0200821 A1 * | 7/2017 | Chang ............... H01L 29/66795 |
| 2017/0365604 A1 * | 12/2017 | Suh ................. H01L 21/823878 |
| 2019/0067113 A1 * | 2/2019 | Chiang ............... H01L 29/0676 |
| 2019/0172752 A1 * | 6/2019 | Hsu .................. H01L 21/31144 |
| 2020/0135922 A1 * | 4/2020 | Chen ..................... H01L 29/785 |
| 2020/0365586 A1 * | 11/2020 | Shin ..................... H01L 27/0886 |
| 2021/0375722 A1 * | 12/2021 | Kim ................ H01L 21/823431 |
| 2022/0069101 A1 | 3/2022 | Choi et al. |
| 2022/0130970 A1 | 4/2022 | Kang et al. |

FOREIGN PATENT DOCUMENTS

| | | |
|---|---|---|
| KR | 20180060943 A | 6/2018 |
| KR | 20180131346 A | 12/2018 |
| KR | 20190063360 A | 6/2019 |
| KR | 20190099990 A | 8/2019 |
| KR | 20200049501 A | 5/2020 |

* cited by examiner

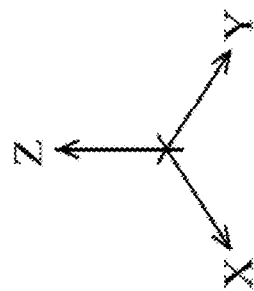
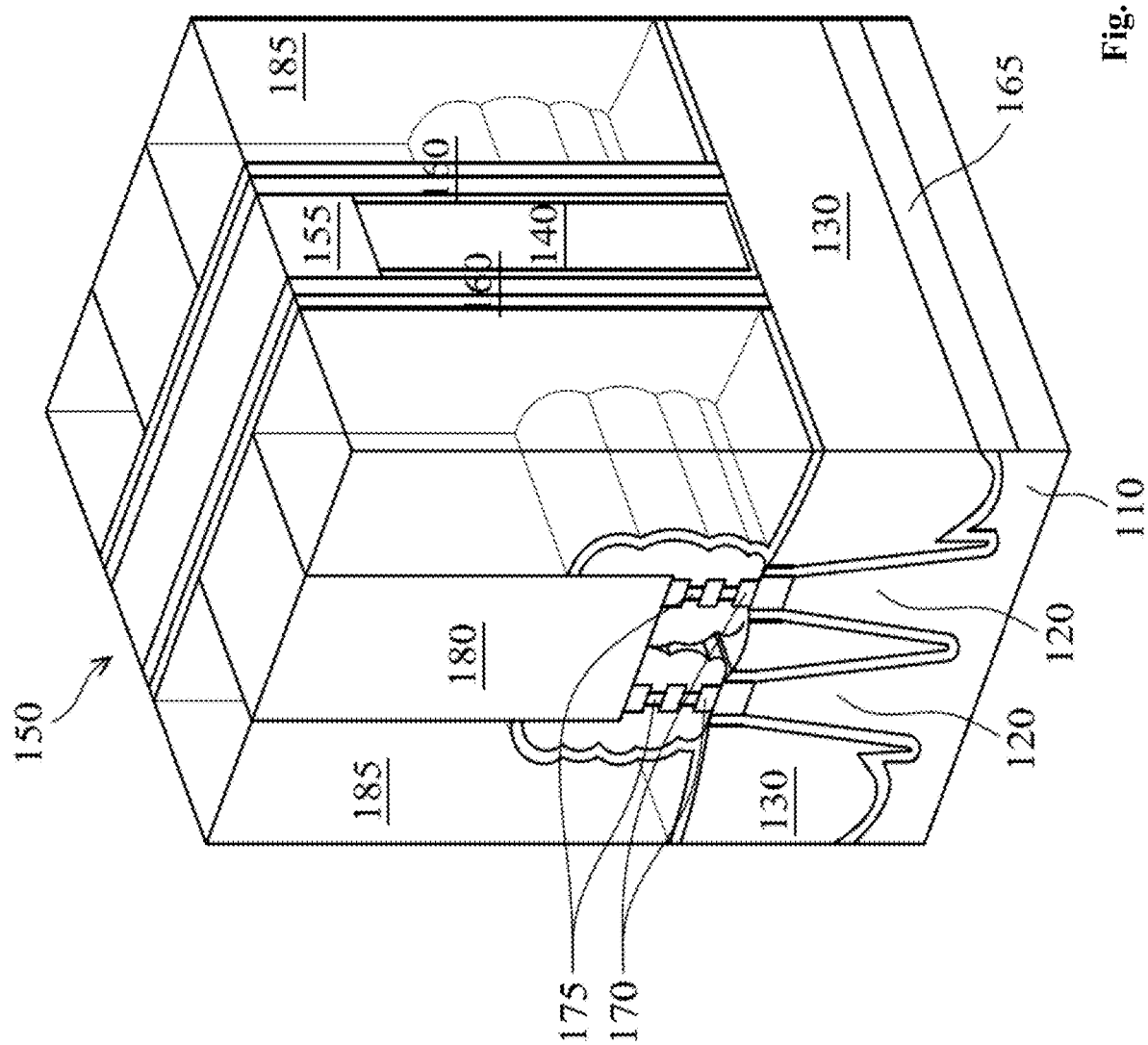
Fig. 1C

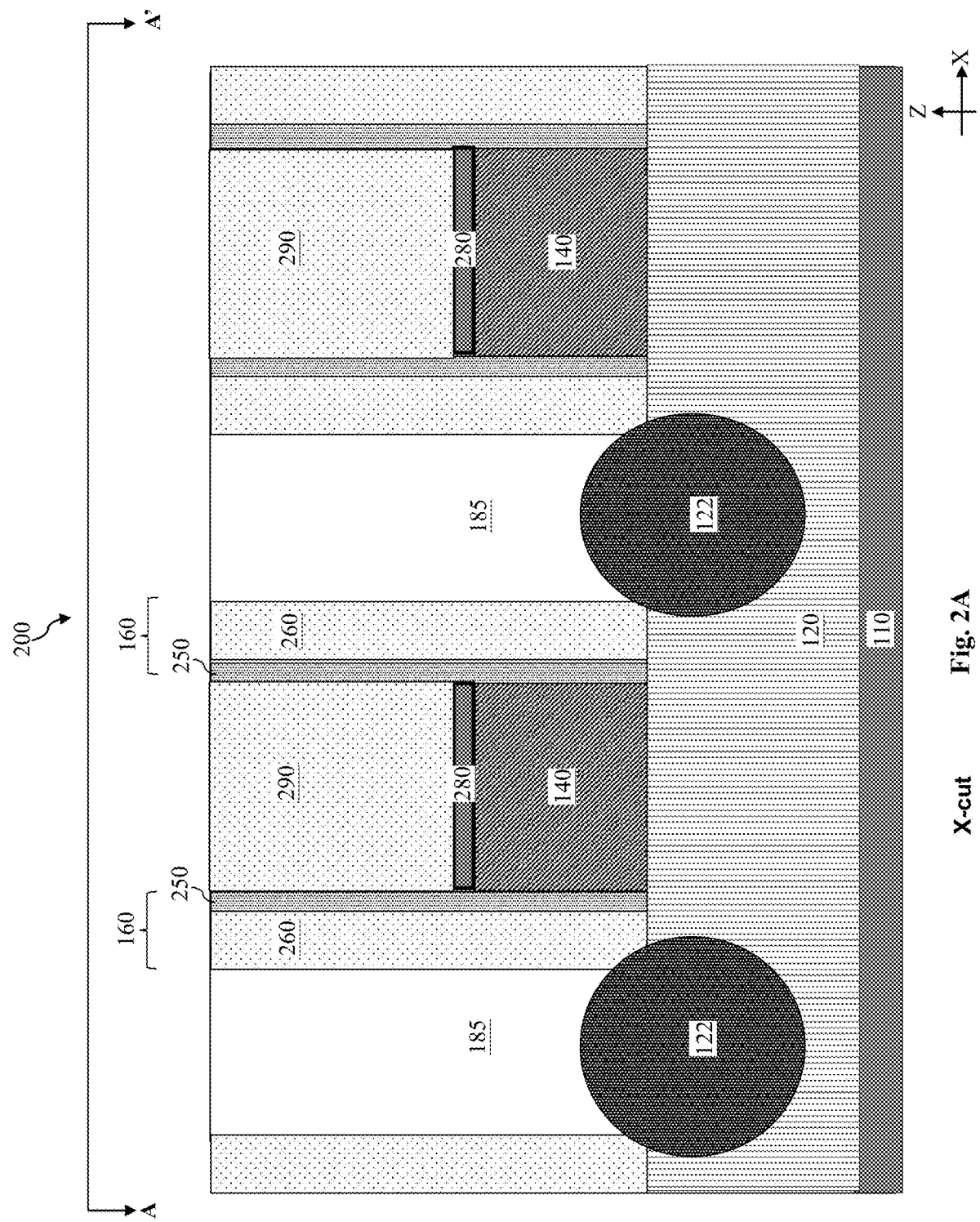
Fig. 2A   X-cut

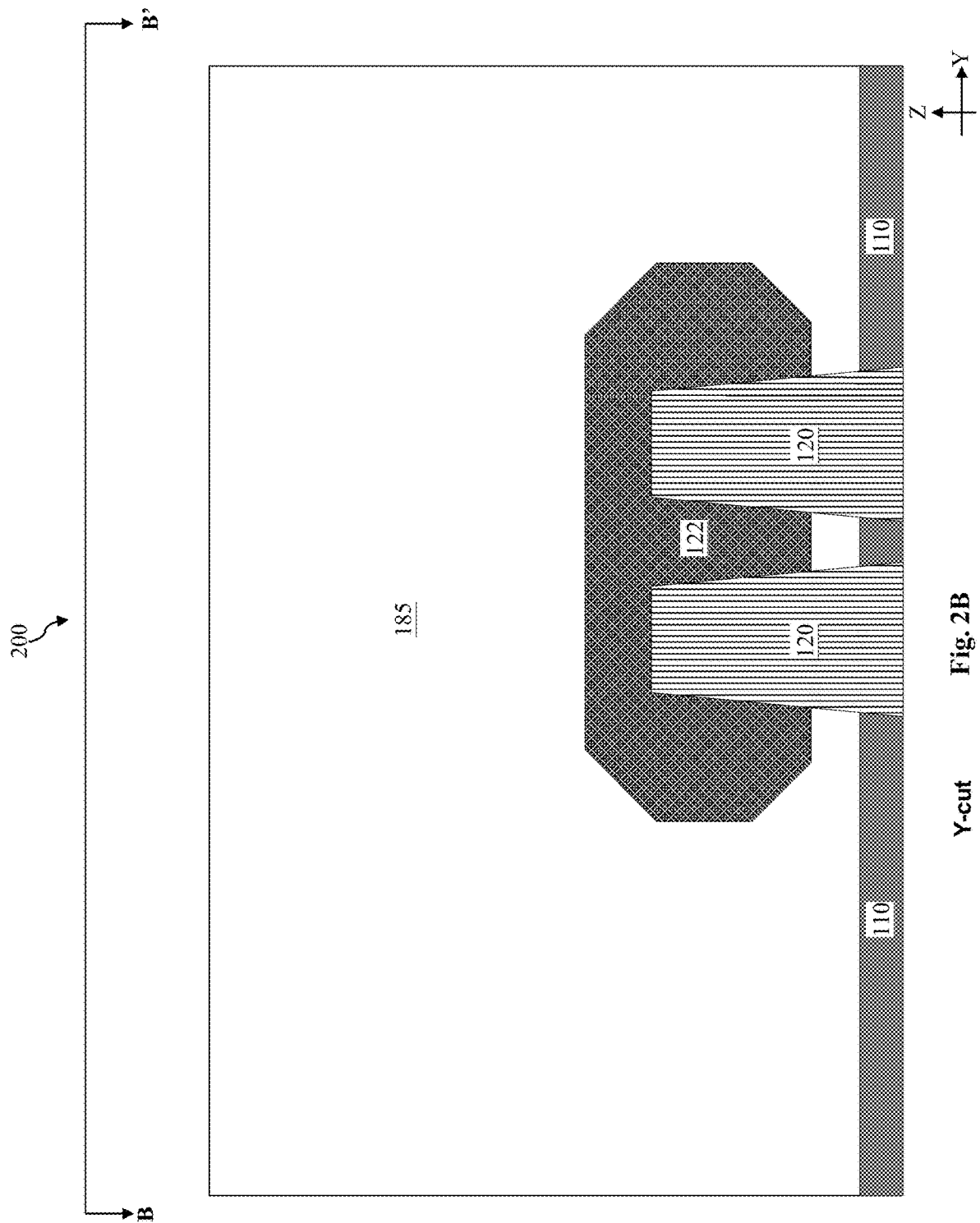

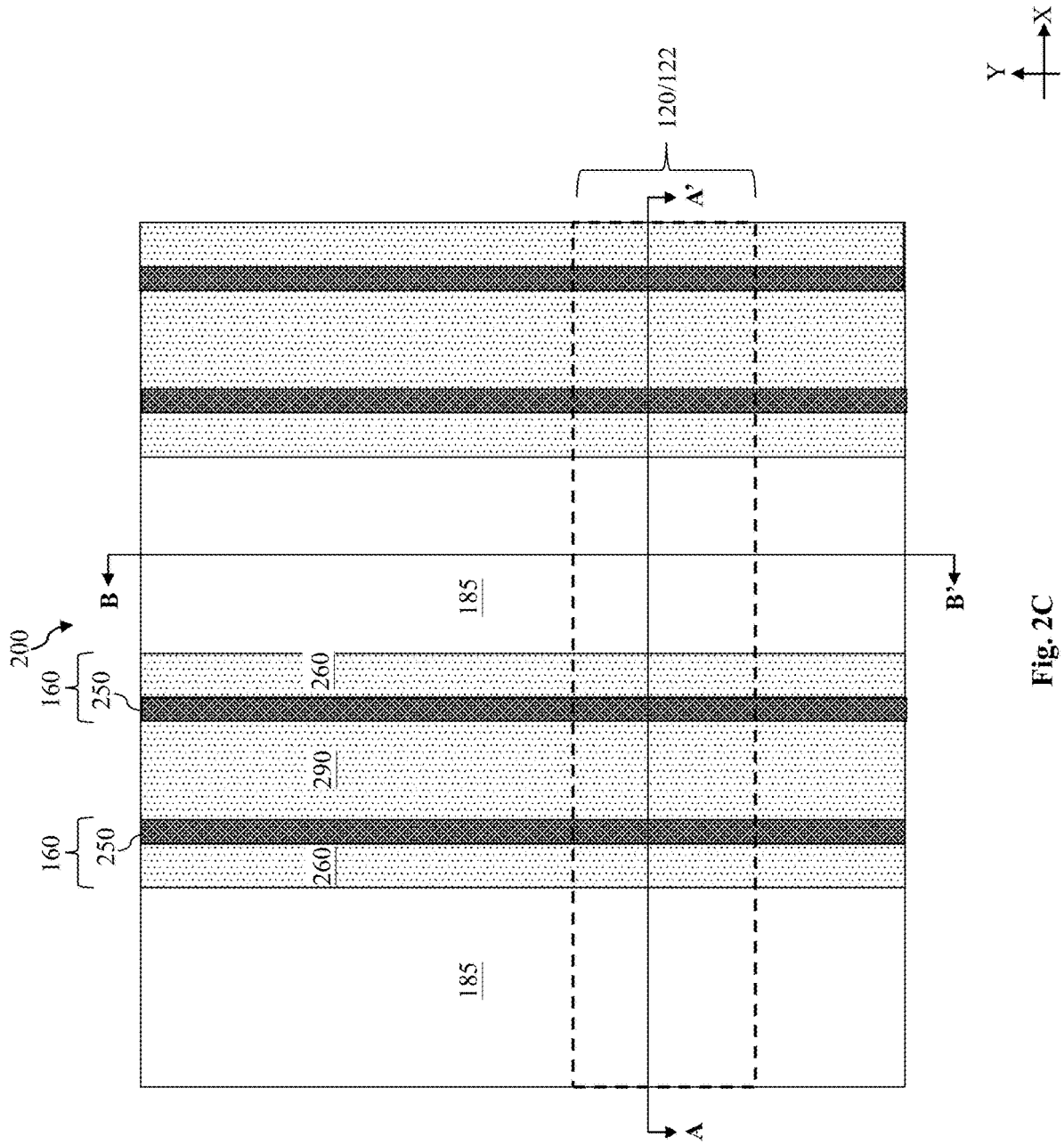

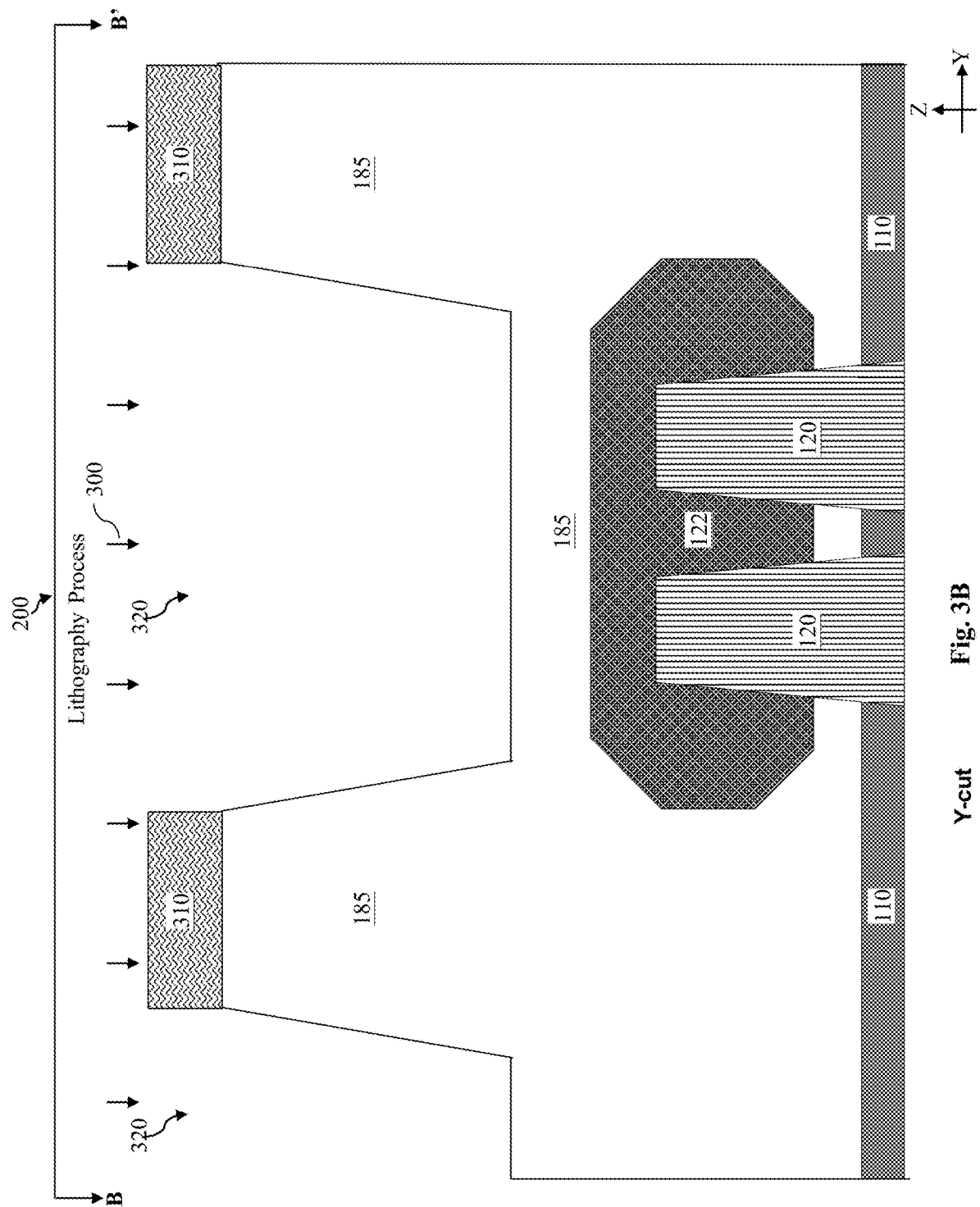

X-cut

Y-cut

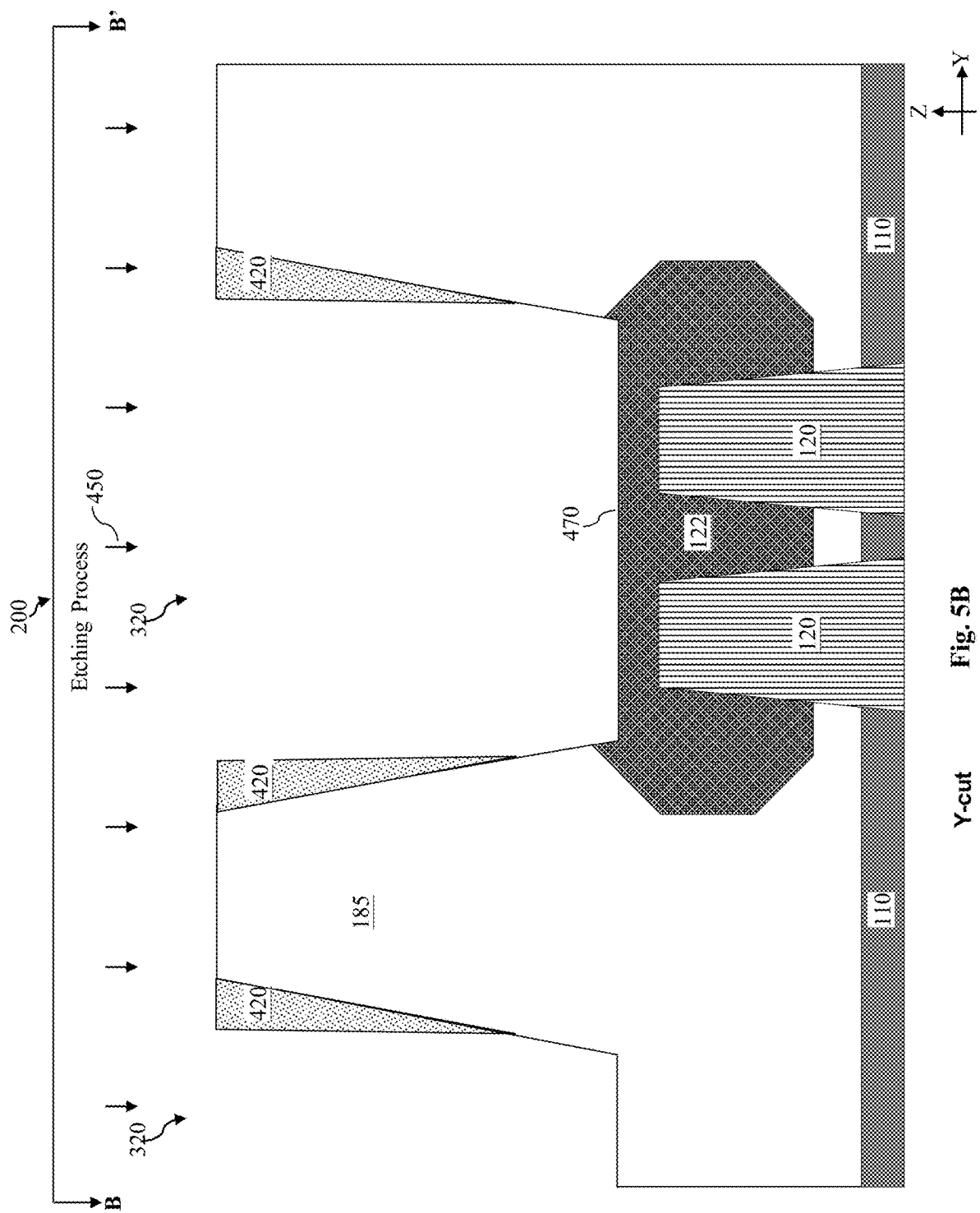

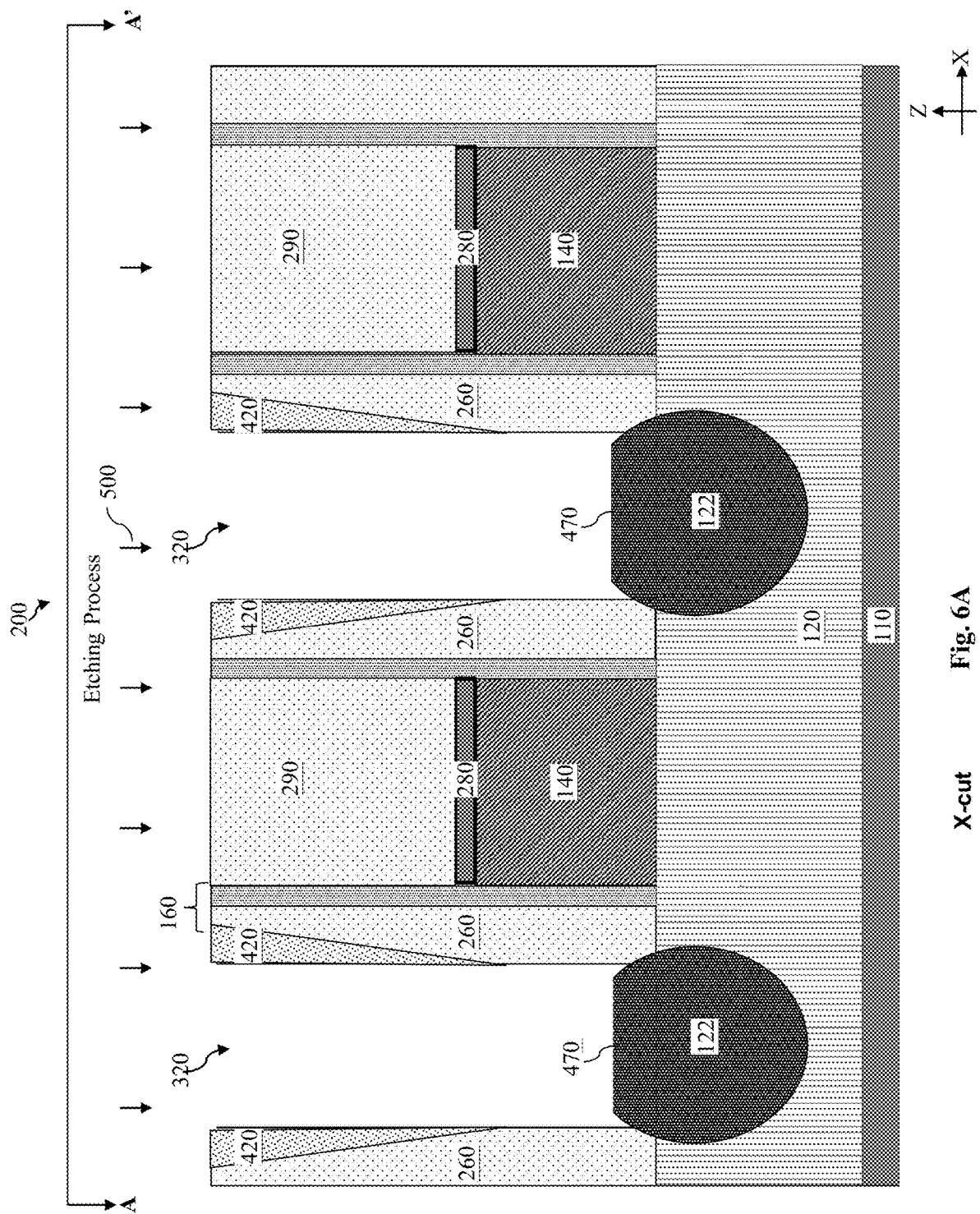
Fig. 6A  X-cut

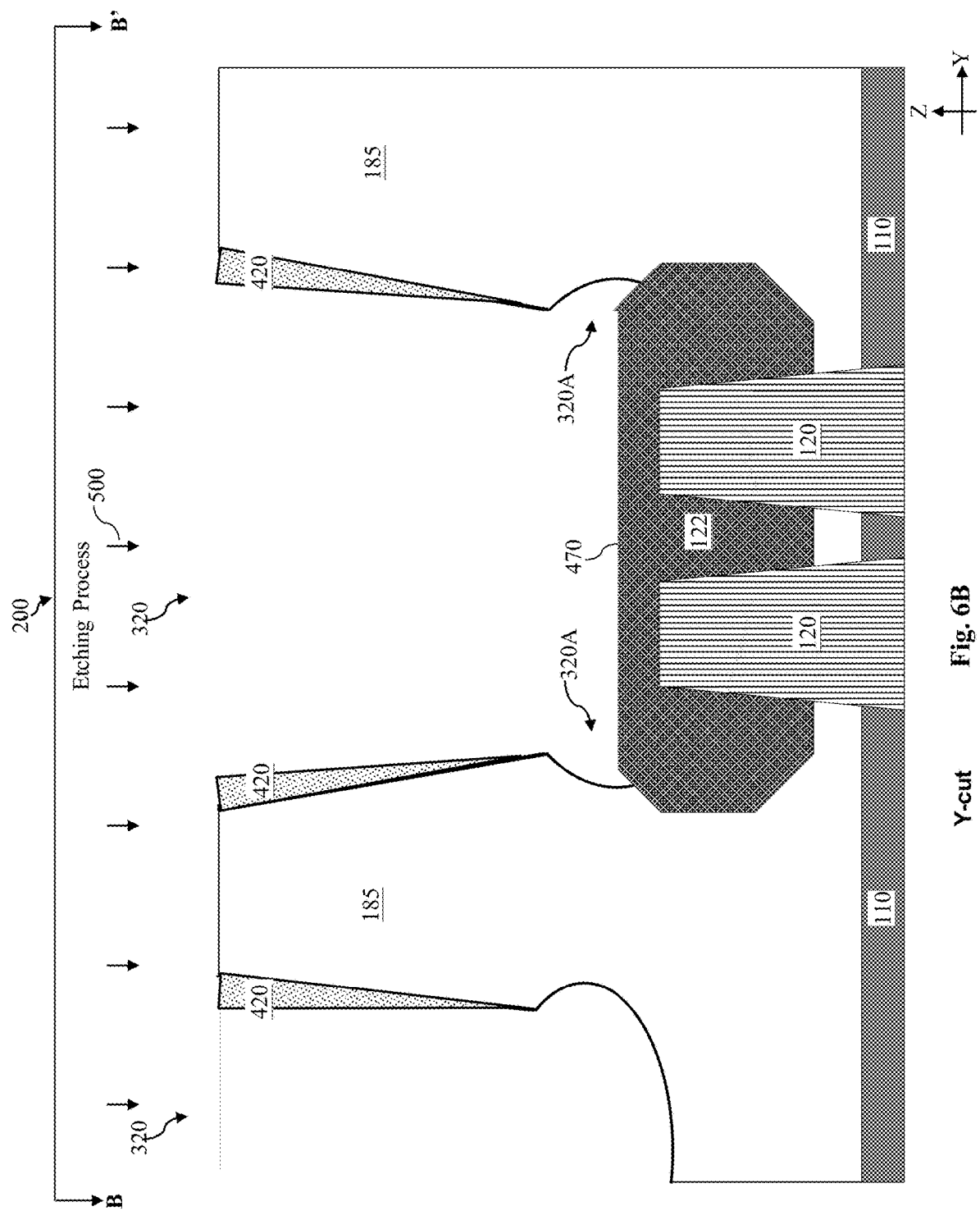
Fig. 6B Y-cut

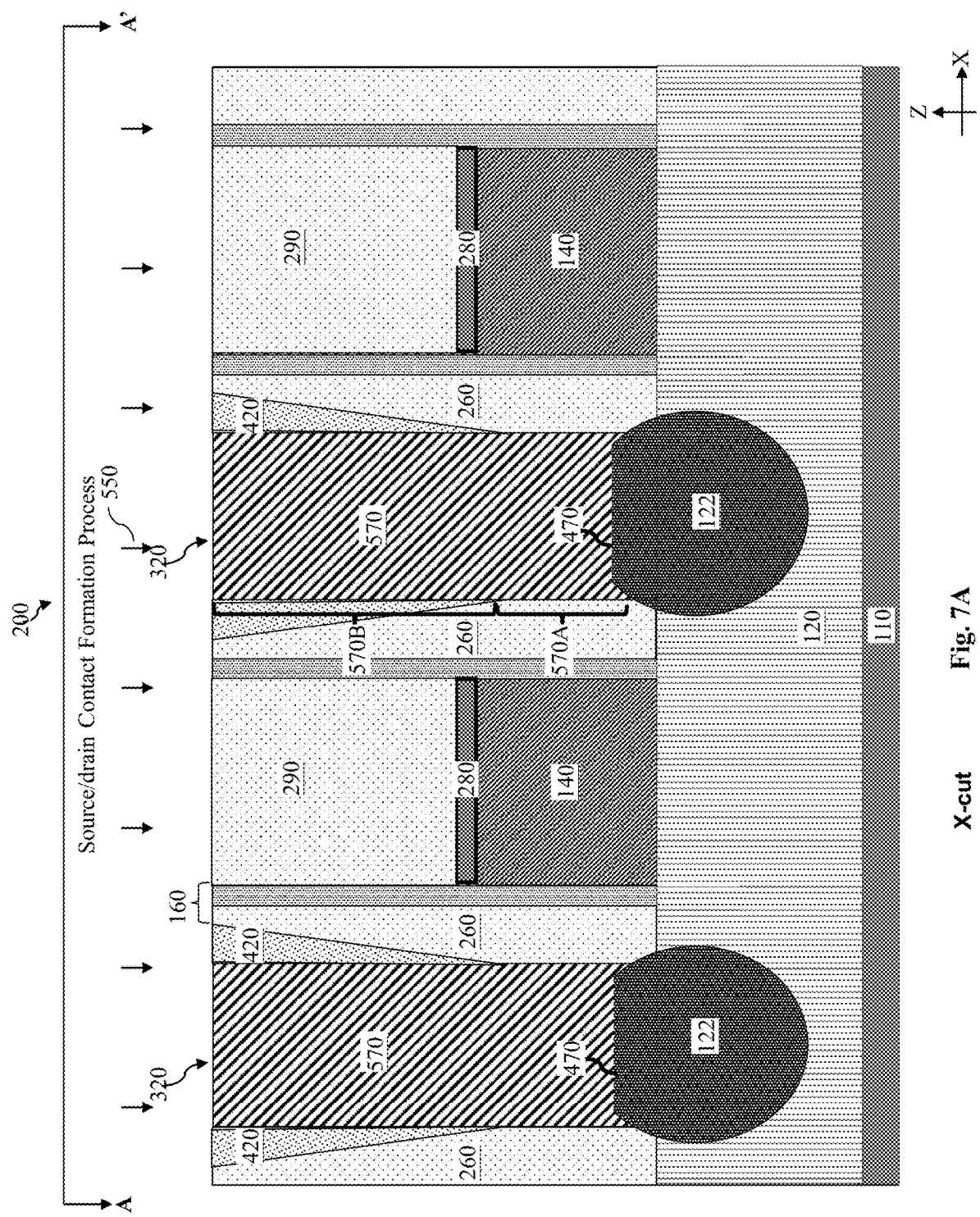
Fig. 7A X-cut

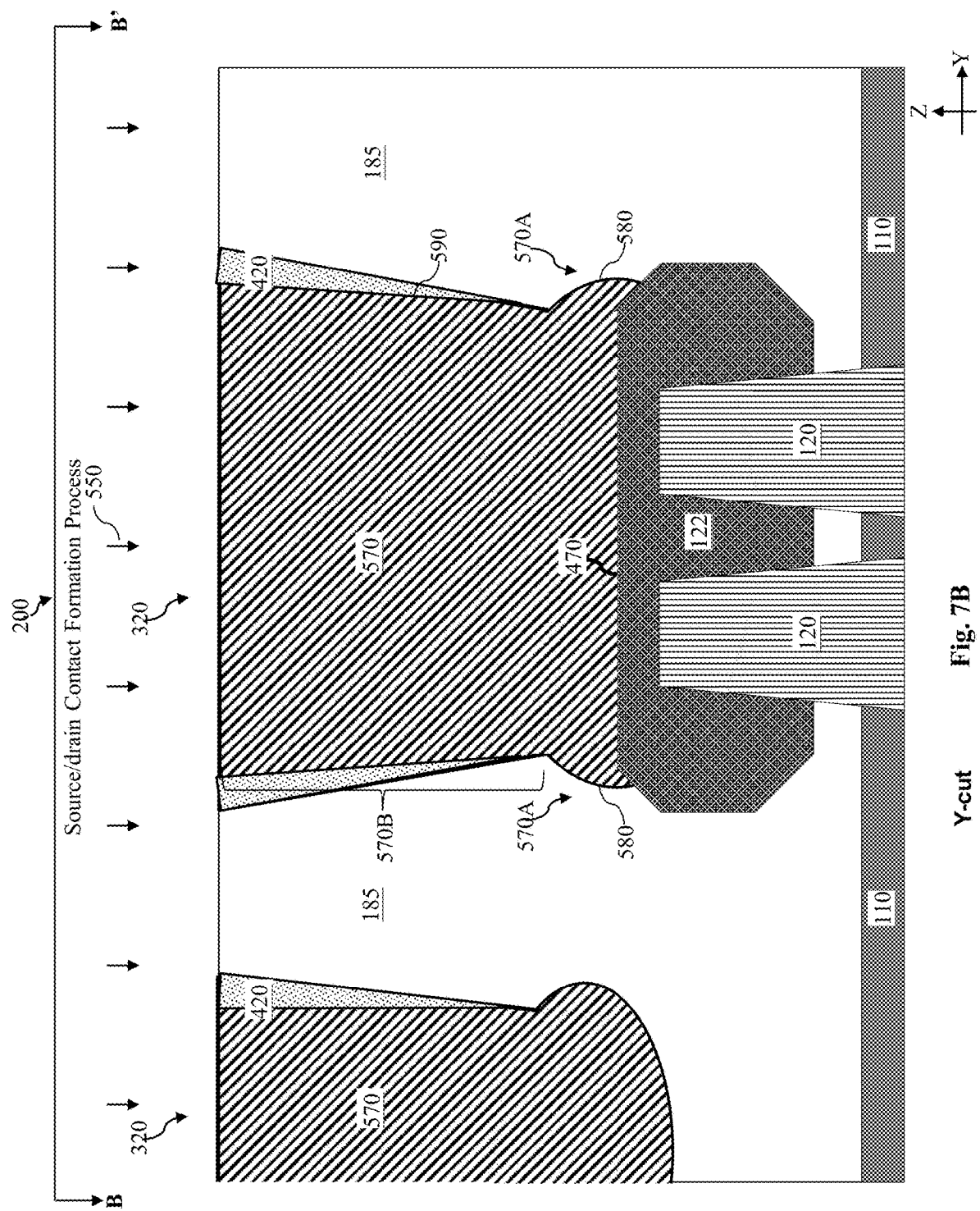

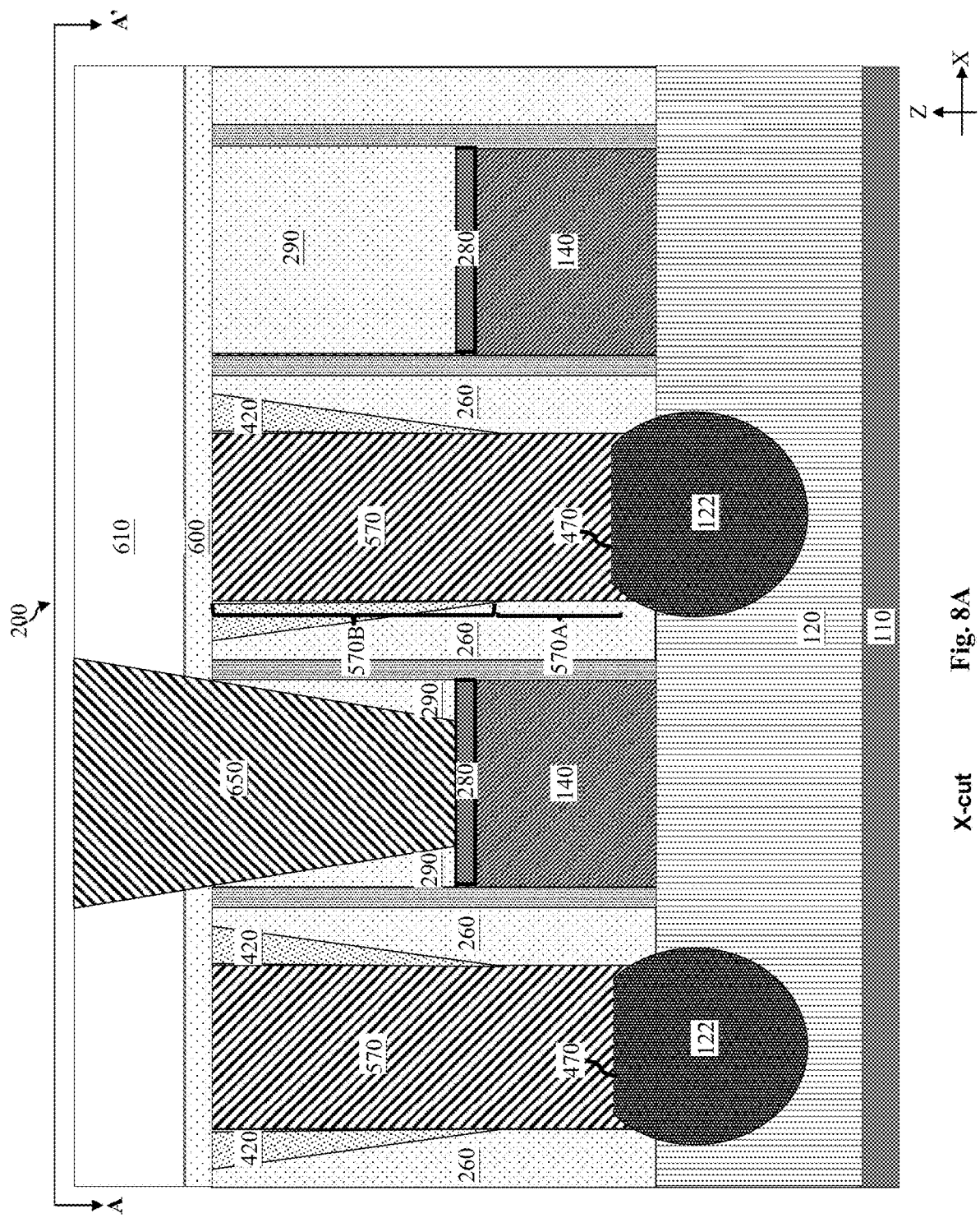
Fig. 8A X-cut

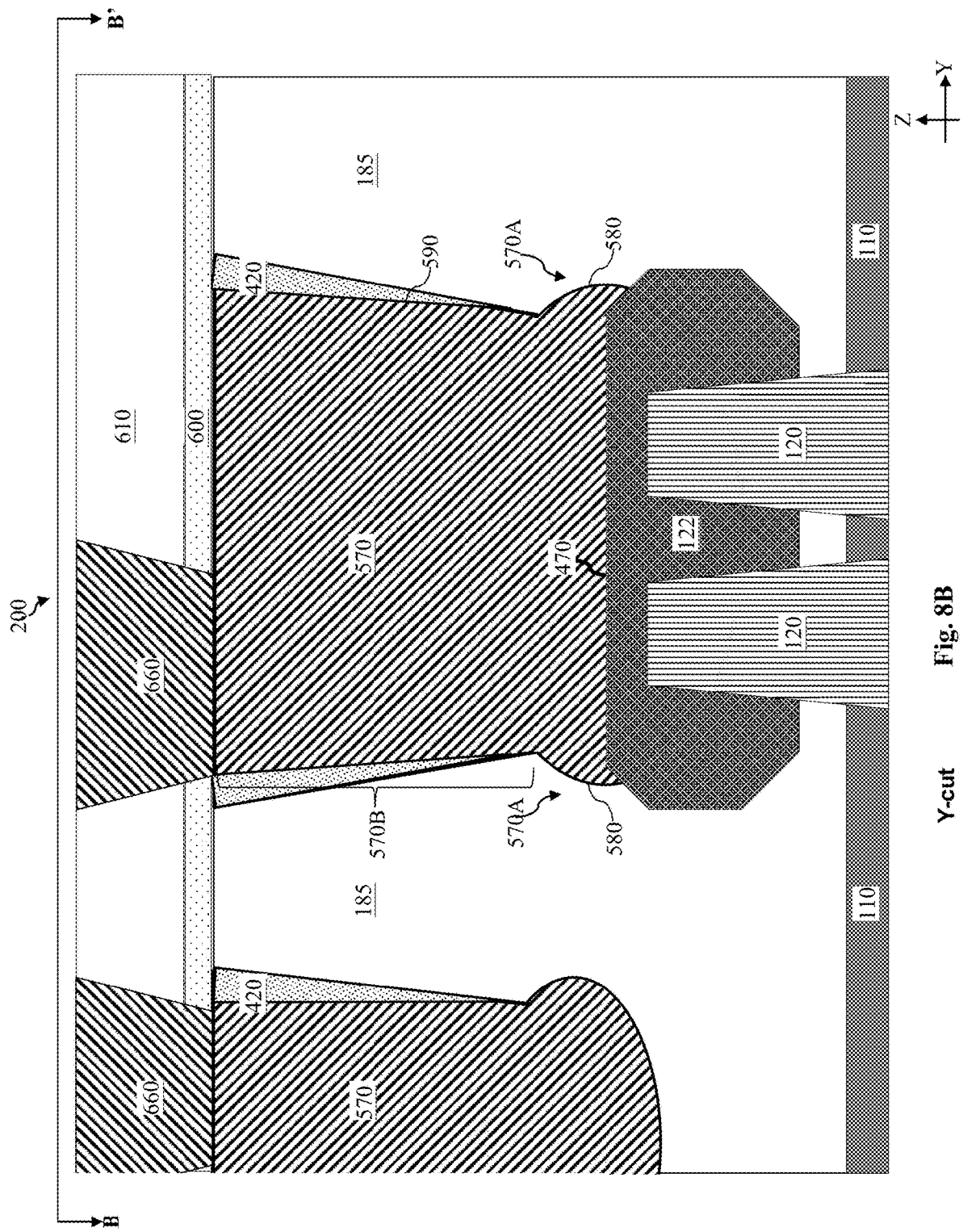
Fig. 8B  Y-cut

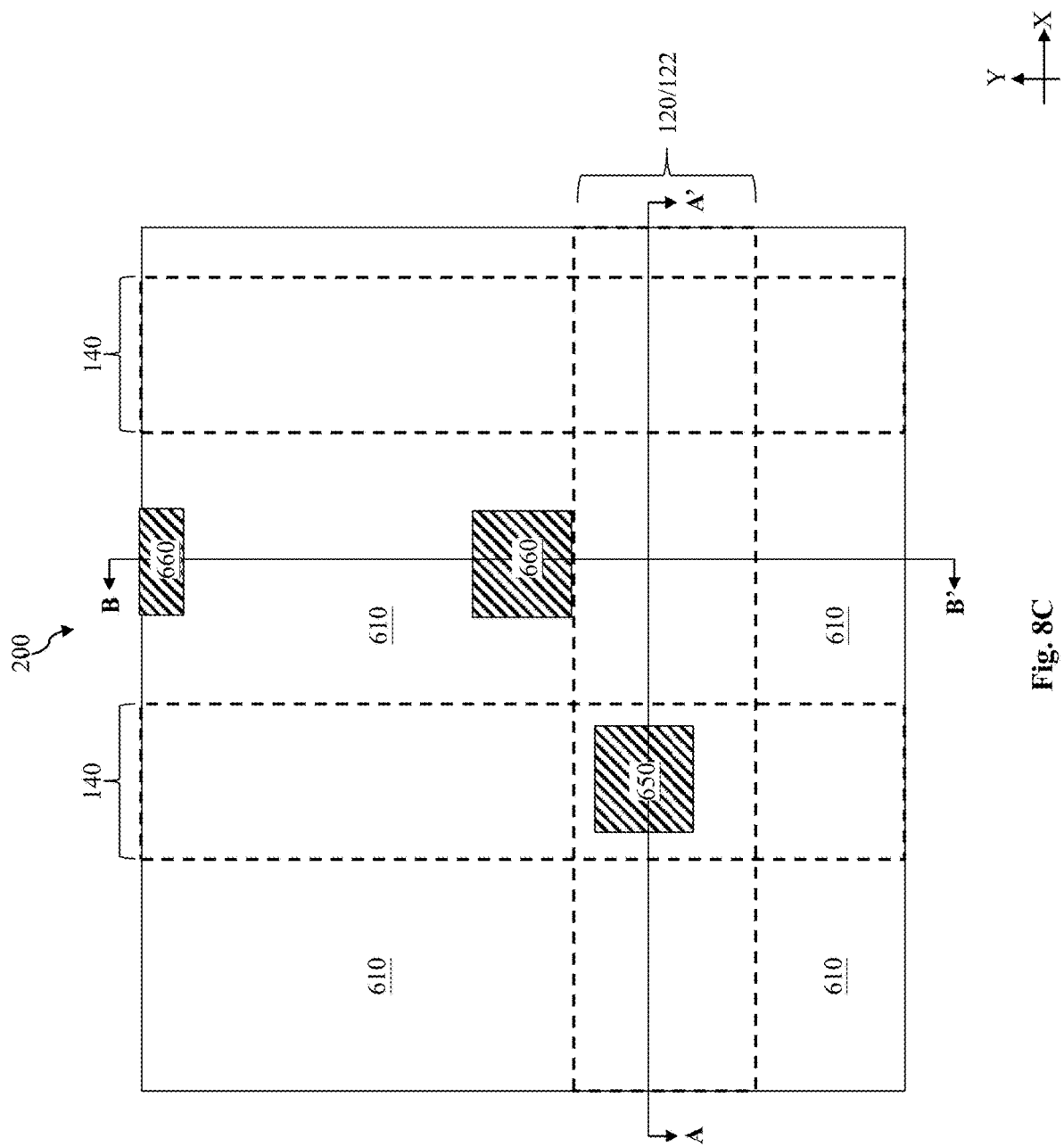

PROTECTIVE LINER FOR SOURCE/DRAIN CONTACT TO PREVENT ELECTRICAL BRIDGING WHILE MINIMIZING RESISTANCE

PRIORITY INFORMATION

This application is a continuation to U.S. patent application Ser. No. 17/186,480 filed on Feb. 26, 2021 and entitled "Protective Liner for Source/Drain Contact to Prevent Electrical Bridging While Minimizing Resistance," issued on Apr. 11, 2023 as U.S. Pat. No. 11,626,495, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as semiconductor devices continue to get scaled down, bridging (e.g., an electrical shorting) between the gate contact and a nearby source/drain contact may be more likely to occur. Unfortunately, conventional methods of preventing such bridging problems may lead to increased electrical resistance and/or a smaller source/drain epi-landing area. As such, device performance may be degraded.

Therefore, although conventional methods of fabricating semiconductor devices have generally been adequate, they have not been satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1C is a perspective view of an IC device in the form of a GAA device according to various aspects of the present disclosure.

FIGS. 2A, 3A, 4A, 5A, 6A, 7A, and 8A are "X-cut" cross-sectional side views of various embodiments of IC devices at various stages of fabrication according to various aspects of the present disclosure.

FIGS. 2B, 3B, 4B, 5B, 6B, 7B, and 8B are "Y-cut" cross-sectional side views of various embodiments of IC devices at various stages of fabrication according to various aspects of the present disclosure.

FIGS. 2C, 3C, 4C, 5C, 6C, 7C, and 8C are planar top views of various embodiments of IC devices at various stages of fabrication according to various aspects of the present disclosure.

DETAILED DESCRIPTION

Figures 1A, 1B:
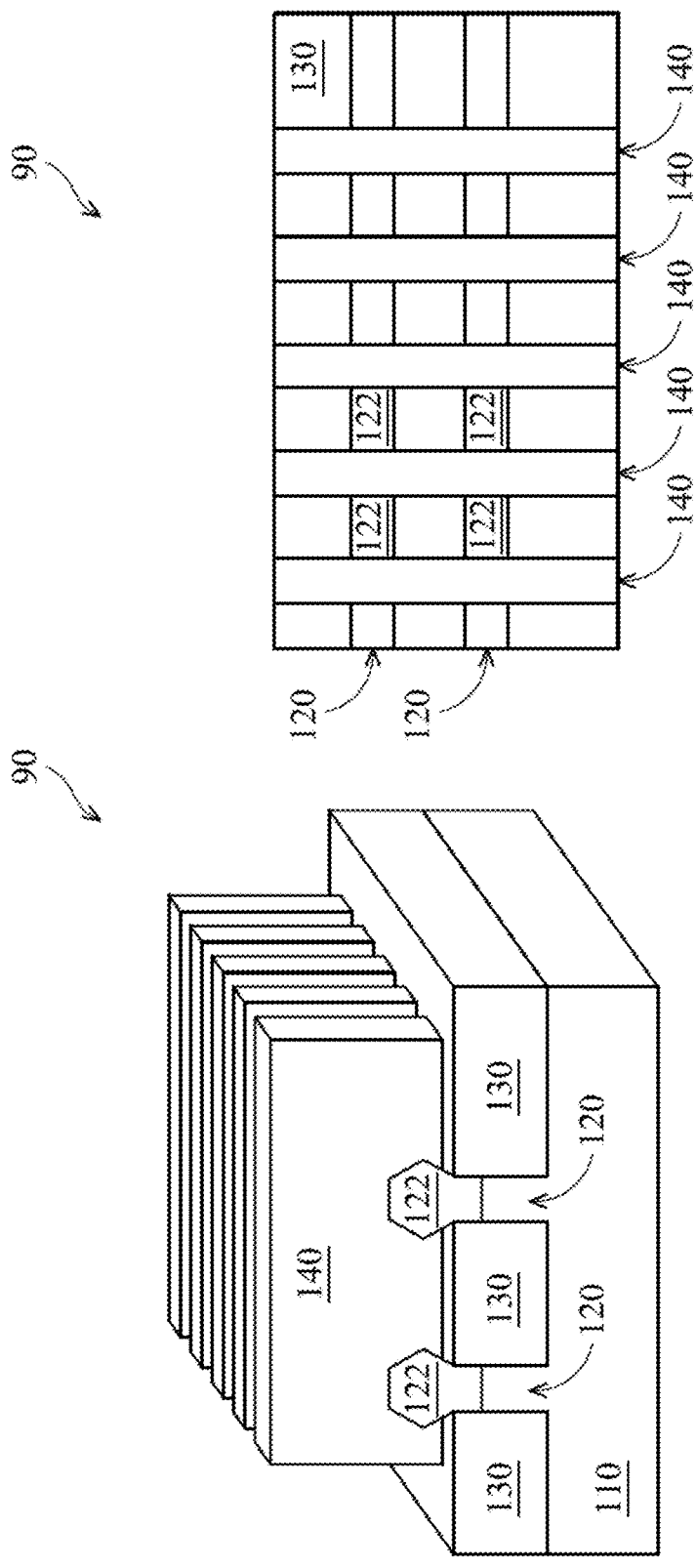
FIG. 1A is a perspective view of an IC device in the form of a FinFET according to various aspects of the present disclosure.
FIG. 1B is a planar top view of an IC device in the form of a FinFET according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc., as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices, and more particularly to field-effect transistors (FETs), such as planar FETs, three-dimensional fin-line FETs (FinFETs), or gate-all-around (GAA) devices.

One aspect of the present disclosure involves a novel fabrication process flow to form uniquely shaped protective liners that are located on a portion (but not all) of the sidewalls of source/drain contacts, in order to minimize electrical resistance while still preventing electrical bridging. In more detail, as semiconductor fabrication progresses to ever-smaller technology nodes, even a slight drift in location of a gate contact may cause bridging (e.g., an electrical shorting) between the gate contact and a nearby source/drain contact. To prevent gate contact and source/drain contact bridging, a protective liner may be formed on the sidewalls of the source/drain contact. Due to the formation of such a protective liner, even if the location of the gate contact is shifted in a direction toward the source/drain contact, the resulting location-shifted gate contact is still prevented from coming into direct physical contact with the source/drain contact, since the protective liner resides between the gate contact and the source/drain contact and prevents the conductive material of the gate contact from directly touching the source/drain contact. Thus, the protective liner may prevent electrical bridging between the gate contact and the source/drain contact.

However, if the protective liner is formed such that it resides on an entirety of the sidewall of the source/drain contact, one downside is the reduction of the source/drain epi-landing area. In other words, the bottom surface of the protective liner would occupy a portion of the upper surface of the epitaxially-formed source/drain, which reduces the available amount of interface area between the source/drain and the source/drain contact (formed on the source/drain). The reduction in the source/drain surface contact area leads to an increase in electrical resistance associated with the source/drain contact, since electrical resistance is inversely correlated with surface contact area. Increased source/drain contact resistance may lead to greater power consumption and/or reduction in speed, which would degrade device performance and are therefore undesirable.

To overcome these problems discussed above, the present disclosure utilizes a novel fabrication process flow to form a protective liner that resides on an upper portion of the sidewall of the source/drain contact, rather on an entirety of the sidewall of the source/drain contact. The absence of the protective layer at a bottom portion of the sidewall of the source/drain contact means that 100% of the upper surface of the epitaxial source/drain component may be available for the landing of the source/drain contact. In other words, the present disclosure provides a greater interface area between the bottom surface of the source/drain contact and the top surface of the epitaxial source/drain component. Such an increase in the interface area reduces source/drain contact resistance, thereby improving device performance. Meanwhile, the protective liner of the present disclosure can still effectively block the gate contact from bridging with the source/drain contact. This is because the gate contact has a more elevated position vertically than the source/drain contact, meaning that electrical bridging (if it occurred at all) would have occurred at the top or middle portions of the source/drain contact (which are still protected by the protective liner), rather than at the bottom portion of the source/drain contact (which is free of the protective liner). The various aspects of the present disclosure are discussed below in more detail with reference to FIGS. 2A-8A, 2B-8B, 2C-8C, and 9-11.

FIGS. 1A and 1B illustrate a three-dimensional perspective view and a top view, respectively, of a portion of an Integrated Circuit (IC) device 90. The IC device 90 may be an intermediate device fabricated during processing of an IC, or a portion thereof, that may comprise static random-access memory (SRAM) and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, and/or other memory cells. The present disclosure is not limited to any particular number of devices or device regions, or to any particular device configurations, unless otherwise claimed. For example, although the IC device 90 as illustrated is a three-dimensional FinFET device, the concepts of the present disclosure may also apply to planar FET devices or GAA devices.

Referring to FIG. 1A, the IC device 90 includes a substrate 110. The substrate 110 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor such as SiGe, GaAsP, AlInAs, AlGaAs, GaInAs, GaInP, GaInAsP, and/or other suitable materials. The substrate 110 may be a single-layer material having a uniform composition. Alternatively, the substrate 110 may include multiple material layers having similar or different compositions suitable for IC device manufacturing. In one example, the substrate 110 may be a silicon-on-insulator (SOI) substrate having a semiconductor silicon layer formed on a silicon oxide layer. In another example, the substrate 110 may include a conductive layer, a semiconductor layer, a dielectric layer, other layers, or combinations thereof. Various doped regions, such as source/drain regions, may be formed in or on the substrate 110. The doped regions may be doped with n-type dopants, such as phosphorus or arsenic, and/or p-type dopants, such as boron, depending on design requirements. The doped regions may be formed directly on the substrate 110, in a p-well structure, in an n-well structure, in a dual-well structure, or using a raised structure. Doped regions may be formed by implantation of dopant atoms, in-situ doped epitaxial growth, and/or other suitable techniques.

Three-dimensional active regions 120 are formed on the substrate 110. The active regions 120 are elongated fin-like structures that protrude upwardly out of the substrate 110. As such, the active regions 120 may be interchangeably referred to as fin structures 120 or fin structures 120 hereinafter. The fin structures 120 may be fabricated using suitable processes including photolithography and etch processes. The photolithography process may include forming a photoresist layer overlying the substrate 110, exposing the photoresist to a pattern, performing post-exposure bake processes, and developing the photoresist to form a masking element (not shown) including the resist. The masking element is then used for etching recesses into the substrate 110, leaving the fin structures 120 on the substrate 110. The etching process may include dry etching, wet etching, reactive ion etching (RIE), and/or other suitable processes. In some embodiments, the fin structure 120 may be formed by double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. As an example, a layer may be formed over a substrate and patterned using a photolithography process. Spacers are formed alongside the patterned layer using a self-aligned process. The layer is then removed, and the remaining spacers, or mandrels, may be used to pattern the fin structures 120. The IC device 90 also includes source/drain features 122 formed over the fin structures 120. The source/drain features 122 may include epi-layers that are epitaxially grown on the fin structures 120.

The IC device 90 further includes isolation structures 130 formed over the substrate 110. The isolation structures 130 electrically separate various components of the IC device 90. The isolation structures 130 may include silicon oxide, silicon nitride, silicon oxynitride, fluoride-doped silicate glass (FSG), a low-k dielectric material, and/or other suitable materials. In some embodiments, the isolation structures 130 may include shallow trench isolation (STI) features. In one embodiment, the isolation structures 130 are formed by etching trenches in the substrate 110 during the formation of the fin structures 120. The trenches may then be filled with an isolating material described above, followed by a chemical mechanical planarization (CMP) process. Other isolation structure such as field oxide, local oxidation of silicon (LOCOS), and/or other suitable structures may also be implemented as the isolation structures 130. Alternatively, the isolation structures 130 may include a multi-layer structure, for example, having one or more thermal oxide liner layers.

The IC device 90 also includes gate structures 140 formed over and engaging the fin structures 120 on three sides in a channel region of each fin 120. The gate structures 140 may be dummy gate structures (e.g., containing an oxide gate dielectric and a polysilicon gate electrode), or they may be HKMG structures that contain a high-k gate dielectric and a metal gate electrode, where the HKMG structures are formed by replacing the dummy gate structures. Though not depicted herein, the gate structure 140 may include additional material layers, such as an interfacial layer over the fin structures 120, a capping layer, other suitable layers, or combinations thereof.

Referring to FIG. 1B, multiple fin structures 120 are oriented lengthwise along the X-direction, and multiple gate structure 140 are oriented lengthwise along the Y-direction, i.e., generally perpendicular to the fin structures 120. In many embodiments, the IC device 90 includes additional features such as gate spacers (including air spacers) disposed along sidewalls of the gate structures 140, hard mask layer(s) disposed over the gate structures 140, and numerous other features.

It is also understood that the various aspects of the present disclosure discussed below may apply to multi-channel devices such as Gate-All-Around (GAA) devices. FIG. 1C illustrates a three-dimensional perspective view of an example GAA device 150. For reasons of consistency and clarity, similar components in FIG. 1C and FIGS. 1A-1B will be labeled the same. For example, active regions such as fin structures 120 rise vertically upwards out of the substrate 110 in the Z-direction. The isolation structures 130 provide electrical separation between the fin structures 120. The gate structure 140 is located over the fin structures 120 and over the isolation structures 130. A mask 155 is located over the gate structure 140, and gate spacer structures 160 (which may include air spacers) are located on sidewalls of the gate structure 140. A capping layer 165 is formed over the fin structures 120 to protect the fin structures 120 from oxidation during the forming of the isolation structures 130.

A plurality of nano-structures 170 are disposed over each of the fin structures 120. The nano-structures 170 may include nano-sheets, nano-tubes, or nano-wires, or some other type of nano-structure that extends horizontally in the X-direction. Portions of the nano-structures 170 under the gate structure 140 may serve as the channels of the GAA device 150. Dielectric inner spacers 175 may be disposed between the nano-structures 170. In addition, although not illustrated for reasons of simplicity, each of the nano-structures 170 may be wrapped around circumferentially by a gate dielectric as well as a gate electrode. In the illustrated embodiment, the portions of the nano-structures 170 outside the gate structure 140 may serve as the source/drain features of the GAA device 150. However, in some embodiments, continuous source/drain features may be epitaxially grown over portions of the fin structures 120 outside of the gate structure 140. Regardless, conductive source/drain contacts 180 may be formed over the source/drain features to provide electrical connectivity thereto. An interlayer dielectric (ILD) 185 is formed over the isolation structures 130 and around the gate structure 140 and the source/drain contacts 180.

Additional details pertaining to the fabrication of GAA devices are disclosed in U.S. Pat. No. 10,164,012, titled "Semiconductor Device and Manufacturing Method Thereof" and issued on Dec. 25, 2018, as well as in U.S. Pat. No. 10,361,278, titled "Method of Manufacturing a Semiconductor Device and a Semiconductor Device" and issued on Jul. 23, 2019, and also in U.S. Pat. No. 9,887,269, titled "Multi-Gate Device and Method of Fabrication Thereof" and issued on Feb. 6, 2018, the disclosures of each which are hereby incorporated by reference in their respective entireties. To the extent that the present disclosure refers to a fin structure or FinFET devices, such discussions may apply equally to the GAA devices.

FIGS. 2A-8A, 2B-8B, and 2C-8C illustrate the cross-sectional side views and top views of an IC device 200 at different stages of fabrication. In more detail, FIGS. 2A-8A correspond to the cross-sectional cuts taken along an X-direction, and FIGS. 2B-8B correspond to the cross-sectional cuts taken along a Y-direction. As such, FIGS. 2A-8A may be referred to as X-cut Figures, and FIGS. 2B-8B may be referred to as Y-cut Figures. FIGS. 2C-8C are the top view figures of the IC device 200 at the different stages of fabrication corresponding to FIGS. 2A-8A and 2B-8B. The X-cut figures are taken along a cut-line A-A' shown in FIGS. 2C-8C, and the Y-cut figures are taken along a cut-line B-B' shown in FIGS. 2C-XC. For reasons of consistency and clarity, similar components appearing in FIGS. 1A-1C may be labeled the same in FIGS. 2A-8A, 2B-8B, and 2C-8C.

Referring to FIGS. 2A-2C, the IC device 200 includes the substrate 110 discussed above with reference to FIGS. 1A-1C, for example a silicon substrate. The substrate includes a plurality of active region structures. In the illustrated embodiment, the active region structures include the fin structures 120 discussed above with reference to FIGS. 1A-1B. However, it is understood that in alternative embodiments, the active region structures may include the nano-structures discussed above with reference to FIG. 1C. As shown in FIGS. 2A and 2C, the fin structures 120 each extend laterally in the X-direction. Also, as shown in FIGS. 2B and 2C, the fin structures 120 are separated from one another in the Y-direction by the isolation structures 130. Source/drain components 122 may be formed in or over the substrate 110, which may be formed using an epitaxial growth process. In some embodiments, the source/drain components 122 are grown on/over the fin structures 120 (as shown in FIGS. 2B-2C). In some embodiments, a single one of the source/drain components 122 may be epitaxially grown at least partially over the upper surfaces and side surfaces of multiple fin structures 120.

The interlayer dielectric (ILD) 185 (also shown in FIG. 1C) is formed over the substrate 110 and over the fin structures 120. The ILD 185 may be formed by plasma enhanced chemical vapor deposition (PECVD), flowable CVD (FCVD), or other suitable methods. In some embodiments, the ILD 185 may include silicon oxide. In some other embodiments, the ILD 185 may include a low-k dielectric material having a dielectric constant that is less than the dielectric constant of silicon oxide (which is about 3.9). The ILD 185 may also be referred to as an ILD-0.

The IC device 200 also includes gate structures 140 (also shown in FIGS. 1A-1C) that are formed over the substrate 110. In some embodiments, the gate structures 140 include high-k metal gate (HKMG) gate structures, which may each include a high-k gate dielectric and a metal gate electrode. The gate structures 140 may be performed using a gate replacement process. In more detail, dummy gate structures may be formed first over the substrate 110 and between the source/drain components 122. The dummy gate structures may each include a dummy gate electrode (e.g., a polysilicon gate electrode) and either a dummy gate dielectric (e.g., a silicon oxide gate dielectric) or a high-k gate dielectric (e.g., a dielectric material having a dielectric constant greater than that of silicon oxide).

After the formation of the dummy gate structures, gate spacer structures 160 (also shown in FIG. 1C) may be formed on the sidewalls of the dummy gate structures. In some embodiments, the gate spacer structures 160 may each include multiple gate spacers, for example a gate spacer 250 and a gate spacer 260. The gate spacer 250 is disposed directly on the sidewall of the dummy gate structure and may include a low-k dielectric material (i.e., a dielectric material having a dielectric constant less than about 3.9). The gate spacer 260 is disposed on the sidewall of the gate spacer 250 and may include a silicon nitride material. It is understood that the ILD 185 may be formed after the formation of the gate spacer structures 160. In addition, the gate spacer structures 160 may include air spacers in some embodiments. For reasons of simplicity, the air spacers are not specifically shown in the illustrated embodiments.

As a part of the gate replacement process, the dummy polysilicon gate electrodes of the dummy gate structures may be removed using one or more etching processes, which leaves openings (trenches) defined by the gate spacer structures 160 and the ILD 185. These openings or trenches are subsequently filled by the metal gate electrodes of the gate structures 140. In some embodiments, if the dummy gate structures include a dummy gate dielectric (e.g., a silicon oxide gate dielectric), then the dummy gate dielectric will also be replaced by a high-k gate dielectric as a part of the gate structures 140. Example materials of the high-gate k dielectric include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, or combinations thereof. The metal gate electrode is formed on the high-k gate dielectric and may include one or more work function metal layers and one or more fill metal layers. The work function metal layers may be configured to tune a work function of the respective transistor. Example materials for the work function metal layers may include titanium nitride (TiN), Titanium aluminide (TiAl), tantalum nitride (TaN), titanium carbide (TiC), tantalum carbide (TaC), tungsten carbide (WC), aluminum titanium nitride (TiAlN), zirconium aluminide (ZrAl), tungsten aluminide (WAl), tantalum aluminide (TaAl), hafnium aluminide (HfAl), or combinations thereof. The fill metal layer may serve as a main conductive portion of the gate electrode.

As shown in FIG. 2A, the IC device 200 may further include a metal layer 280 formed over each of the gate structures 140, as well as a mask layer 290 formed over each of the metal layer 280. In some embodiments, the metal layer 280 and the mask layer 290 may each be formed by one or more deposition processes, such as atomic layer deposition (ALD), physical vapor deposition (PVD), chemical vapor deposition (CVD), or combinations thereof. The metal layer 280 may include ruthenium (Ru), cobalt (Co), copper (Cu), aluminum (Al), or another suitable pure metal. The metal layer 280 may also be considered a part of the gate structure 140.

The mask layer 290 may include silicon nitride (SiN) in some embodiments, or a metal oxide in other embodiments, such as tantalum oxide ($Ta_2O_5$), aluminum oxide ($Al_2O_3$), or zirconium oxide ($ZrO_2$). Other suitable materials for the mask layer 290 may include silicon oxynitride (SiON), a nitrogen content oxide, a nitrided oxide, a metal oxide dielectric, a hafnium content oxide (e.g., an oxide material having a hafnium content), a tantalum content oxide, a titanium content oxide, a zirconium content oxide, an aluminum content oxide, a lanthanum content oxide, or a high-K dielectric material, or combinations thereof. It is understood that a planarization process such as a chemical mechanical polishing (CMP) process may also be performed to planarize the upper surfaces of the mask layer 290 and the upper surfaces of the ILD 185. In some embodiments, the HKMG structures 140 may include additional layers, such as interfacial layers, capping layers, diffusion/barrier layers, or other applicable layers. For reasons of simplicity, these additional layers may not be shown herein.

Also note that the fin structures 120 and the source/drain components 122 may not be directly visible in the top view of FIG. 2C at this stage of fabrication, since they are blocked by other components (e.g., the ILD 185 or the gate structures) formed thereover. However, to facilitate the understanding of the present disclosure, the outline or contour of the fin structures 120 and/or source/drain components 122 are denoted by dashed lines in the top view of FIG. 2C.

Figure 3A:
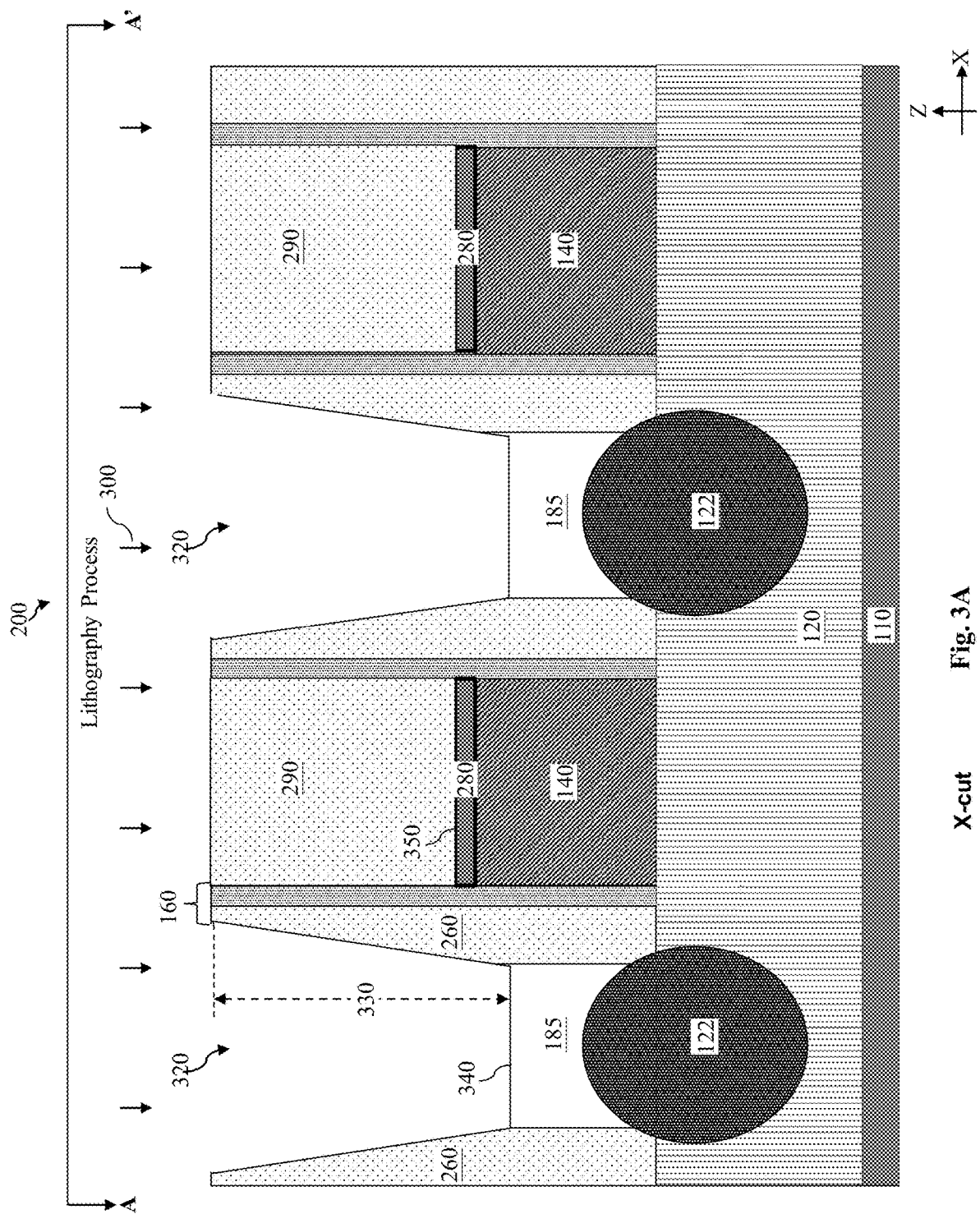
Figure 3C:
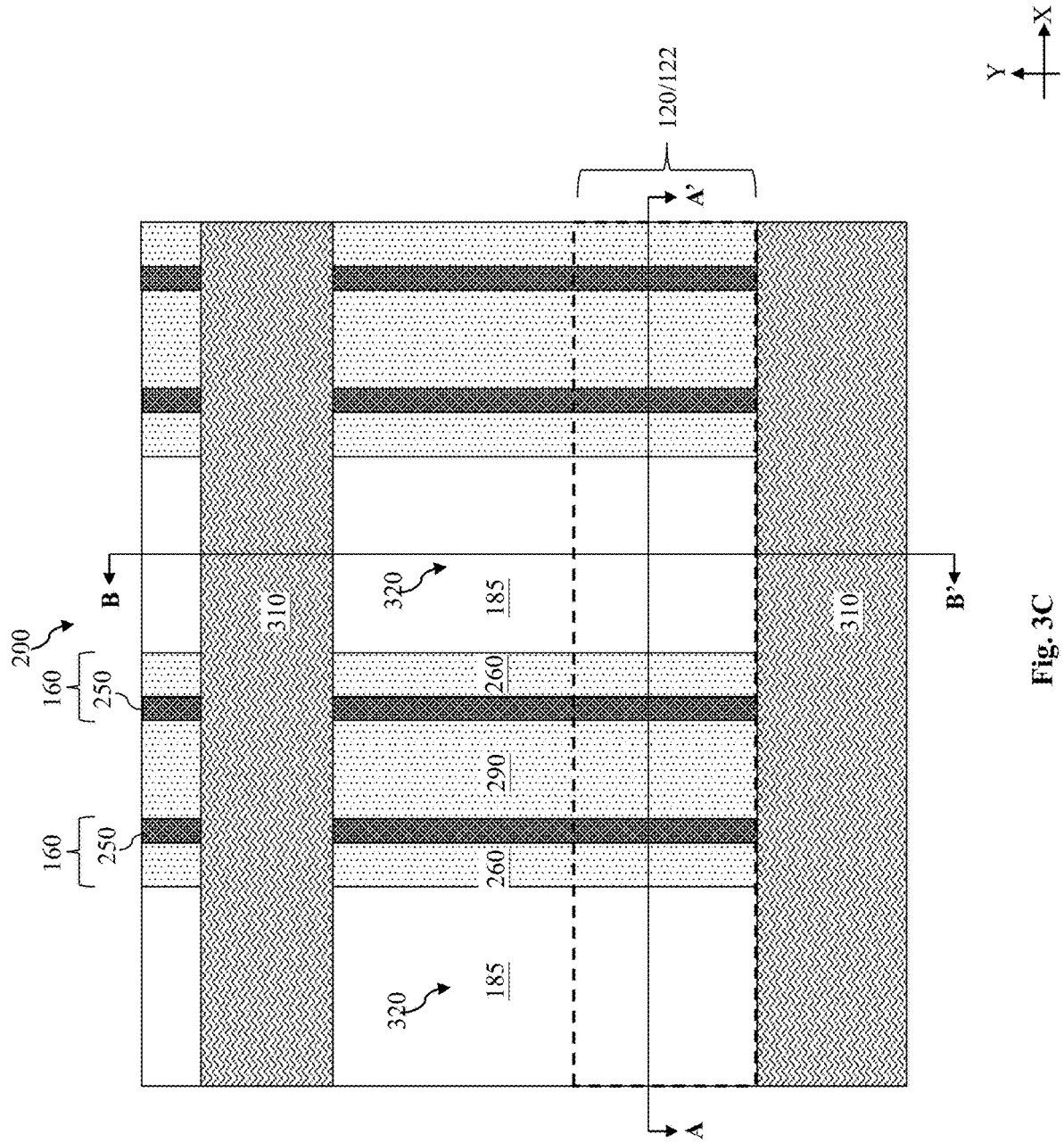

Referring now to FIGS. 3A-3C, a lithography process 300 is performed to the IC device 200. As a part of the lithography process 300, a patterned photoresist layer 310 are formed over the ILD 185, for example, using one or more photoresist spin coating, exposing, baking, developing, and rinsing processes (not necessarily performed in that order). The lithography process 300 also includes an etching process, for example, a wet etching or a dry etching process, which are performed using the patterned photoresist layer 310 as a masking layer. The etching process etches a plurality of openings 320 into the ILD 185. As shown clearly in FIG. 3A, each of the openings 320 is aligned with a respective one of the source/drain components 122. The openings 320 may also be referred to as source/drain contact openings, since they will be filled by a conductive material in a later process to form source/drain contacts therein.

The etching process is performed without completely removing the ILD 185, so that the source/drain components 122 are not exposed. However, the etching process is performed so that a depth 330 (see FIG. 3A) of each of the opening 320 is deep enough such that an upper surface 340 of the remaining portion of the ILD 185 (that is disposed above the source/drain component 122) is at a less elevated position vertically in the Z-direction than an upper surface of the metal layer 280. As will be discussed in more detail below, the openings 320 will be filled by a conductive material to form source/drain contacts, and gate contacts will be formed over the metal layers 280. To avoid electrical shorting (e.g., bridging) between the source/drain contacts and the gate contacts, protective liners will be formed on the sidewalls of the spacers 260 to provide electrical isolation between the source/drain contacts and the gate contacts. Such a depth 330 of the openings 320 allows the protective liners to be sufficiently long to serve their purposes of preventing electrical bridging between the source/drain contacts and the gate contacts, but not too long to take up an interface area between the source/drain contacts (to be formed) and the source/drain components 122. In this manner, electrical resistance of the source/drain contacts will be reduced, which is desirable.

Figure 4A:
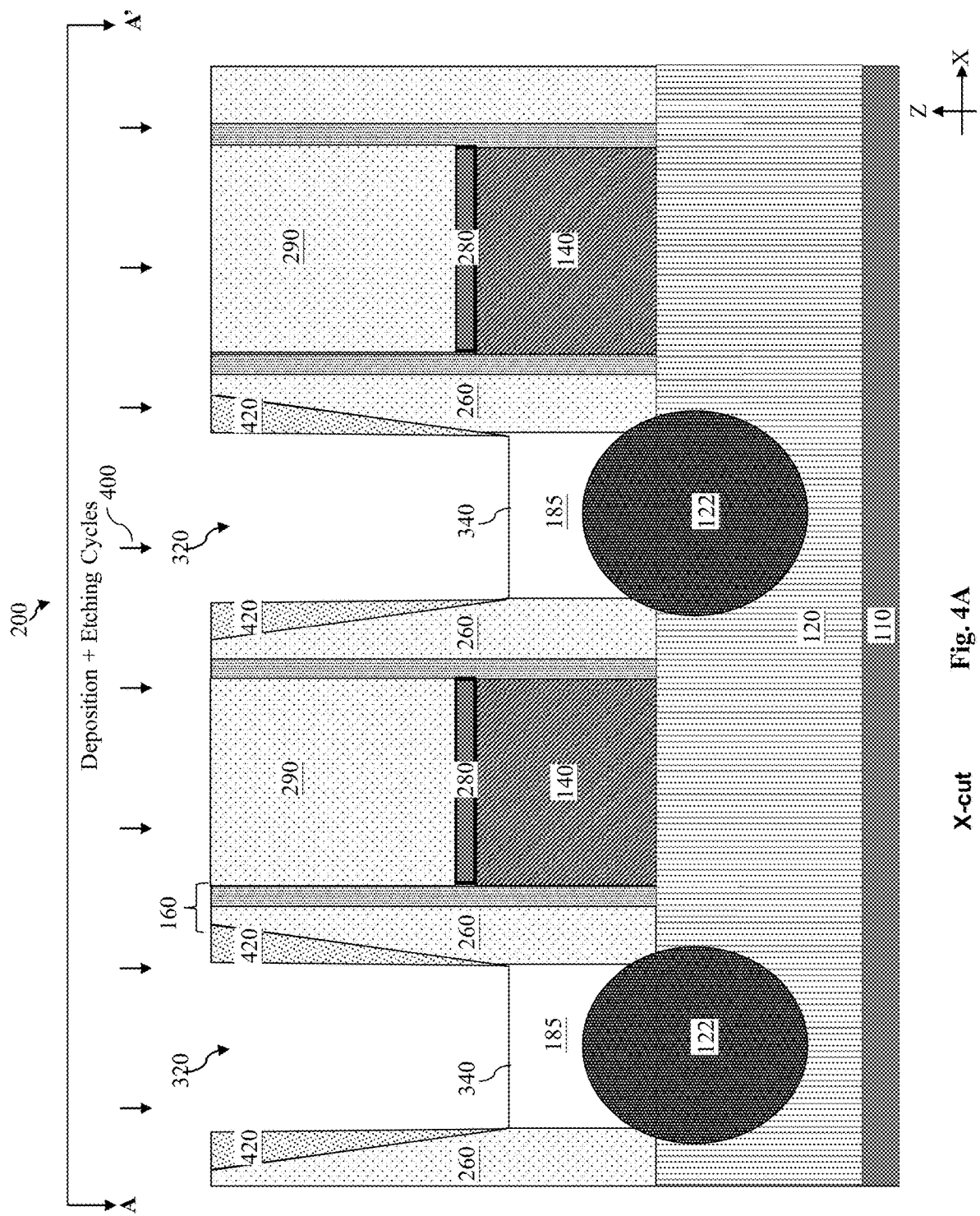
Figure 4B:
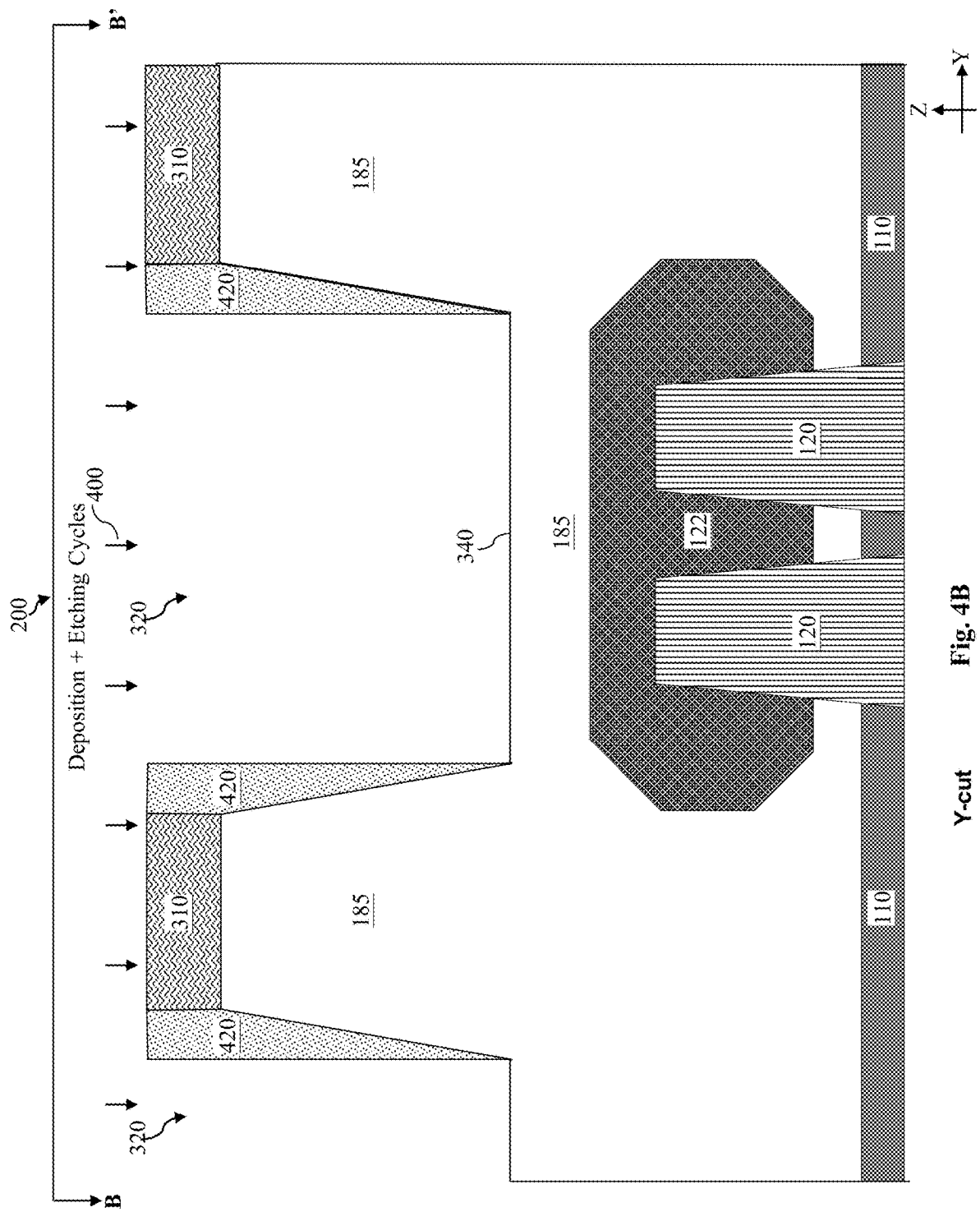
Figure 4C:
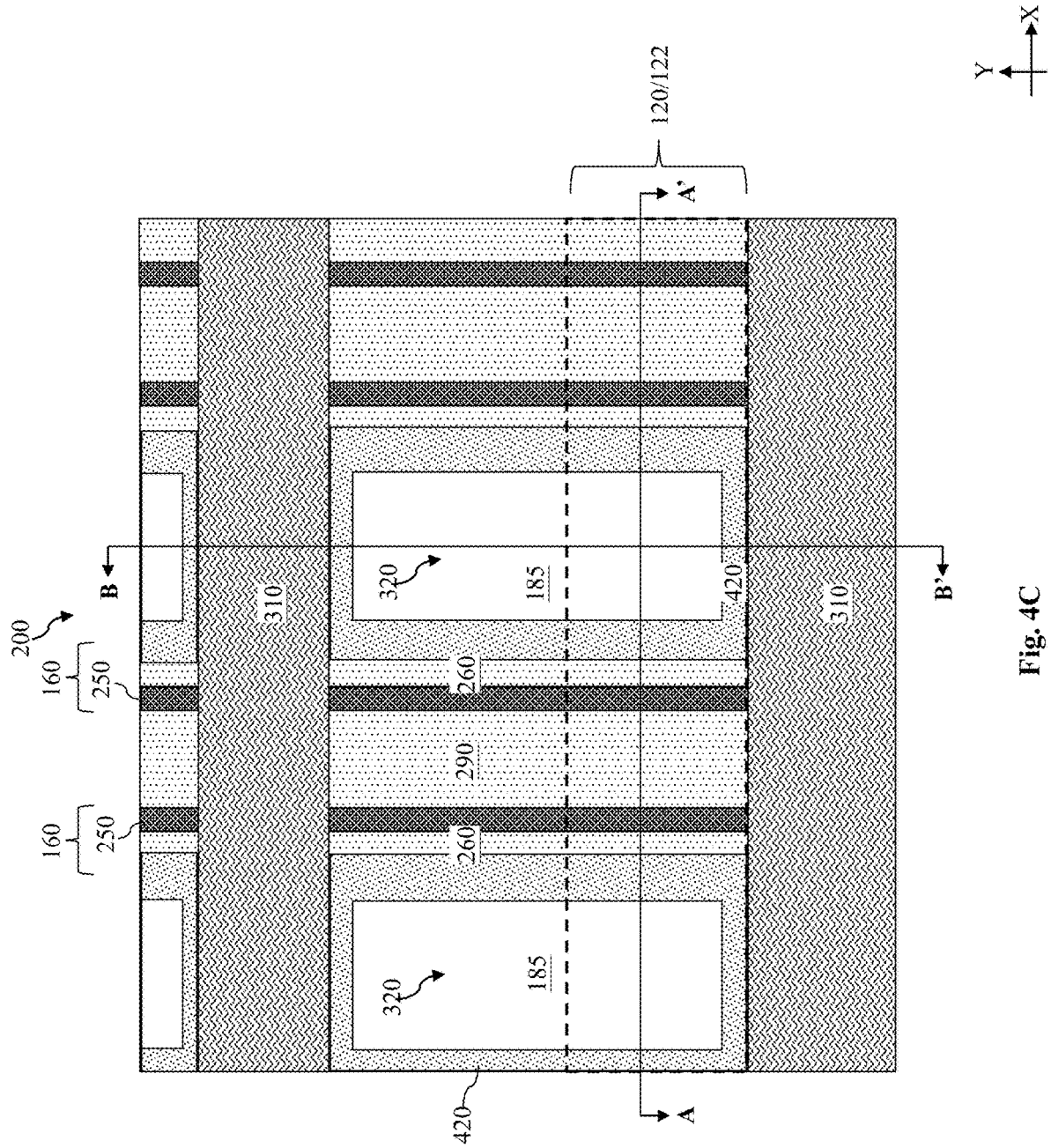

Referring now to FIGS. 4A-4C, a plurality of deposition+ etch cycles 400 are performed to the IC device. In each cycle of the plurality of deposition+etching cycles 400, a deposition process is performed to deposit a dielectric material 420, followed by an etching process to etch the deposited dielectric material 420. The deposition process may include an ALD process in some embodiments, which can be configured to accurately and precisely control a thickness (e.g., in the X-direction) of the deposited dielectric material 420. In some embodiments, the deposited dielectric material 420 may have a same material composition as the gate spacers 260. For example, in some embodiments, both the deposited dielectric material 420 of the deposition process and the gate spacers 260 include silicon nitride. It is understood, however, that the deposited dielectric material 420 may have a different material composition than the gate spacers 260 in other embodiments.

The etching process of the deposition+etching cycles 400 may include a dry etching process or a wet etching process. The parameters of the etching process are configured such that an etching selectivity exists between the deposited dielectric material 420 and the ILD 185, such that the dielectric material 420 may be etched without substantially removing the ILD 185. For example, the etching process may be configured such that an etching rate of the dielectric material 420 is at least three times greater than the etching rate of the ILD 185.

As a result of the performance of the deposition+etching cycles 400, protective liners 420 may be formed by the remaining portions of the deposited-and-etched dielectric materials 420, which are interchangeably referred to herein. Due to the multiple cycles of deposition and etching, the resulting protective liners 420 each has a top-wide-bottom-narrow cross-sectional profile in the cross-sectional plane defined in the X-direction and Z-direction (such as shown in FIG. 4A), as well as in the cross-sectional plane defined in the Y-direction and Z-direction (such as shown in FIG. 4B). In other words, a width (either measured in the X-direction or in the Y-direction) of each of the protective liners 420 is a function of the depth of the protective liner 420: as the depth of the protective liner 420 increases (e.g., closer to the substrate 110), its width decreases. At or near the upper surface of the ILD 185 (i.e., the bottom surface of the openings 320), the width of each of the protective liners 420 may approach 0. As such, the protective liners 420 will not needlessly shrink the volume of what would otherwise be the source/drain contacts, since the source/drain contacts will be formed in the openings 320 in a later process.

Figure 5A:
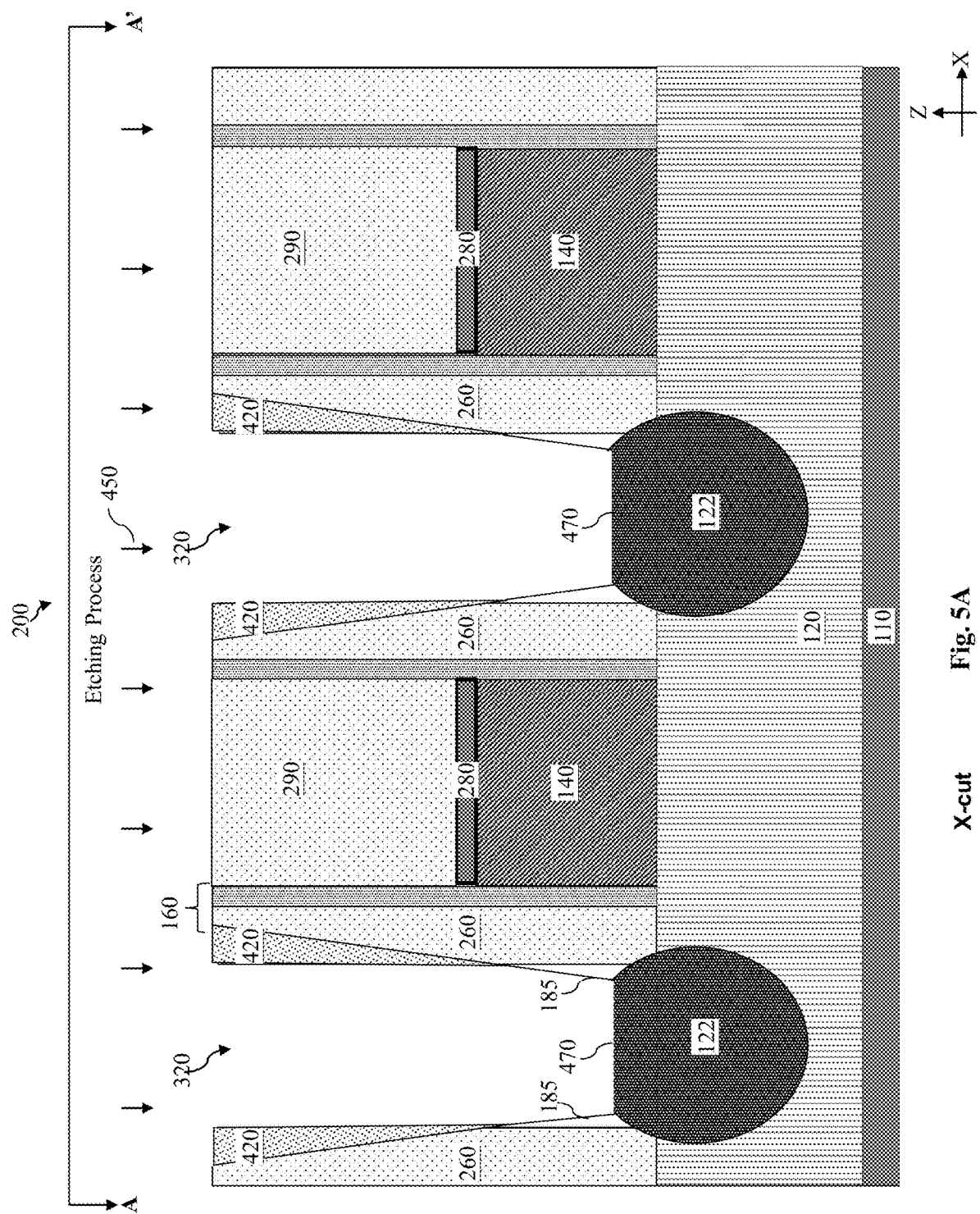
Figure 5C:
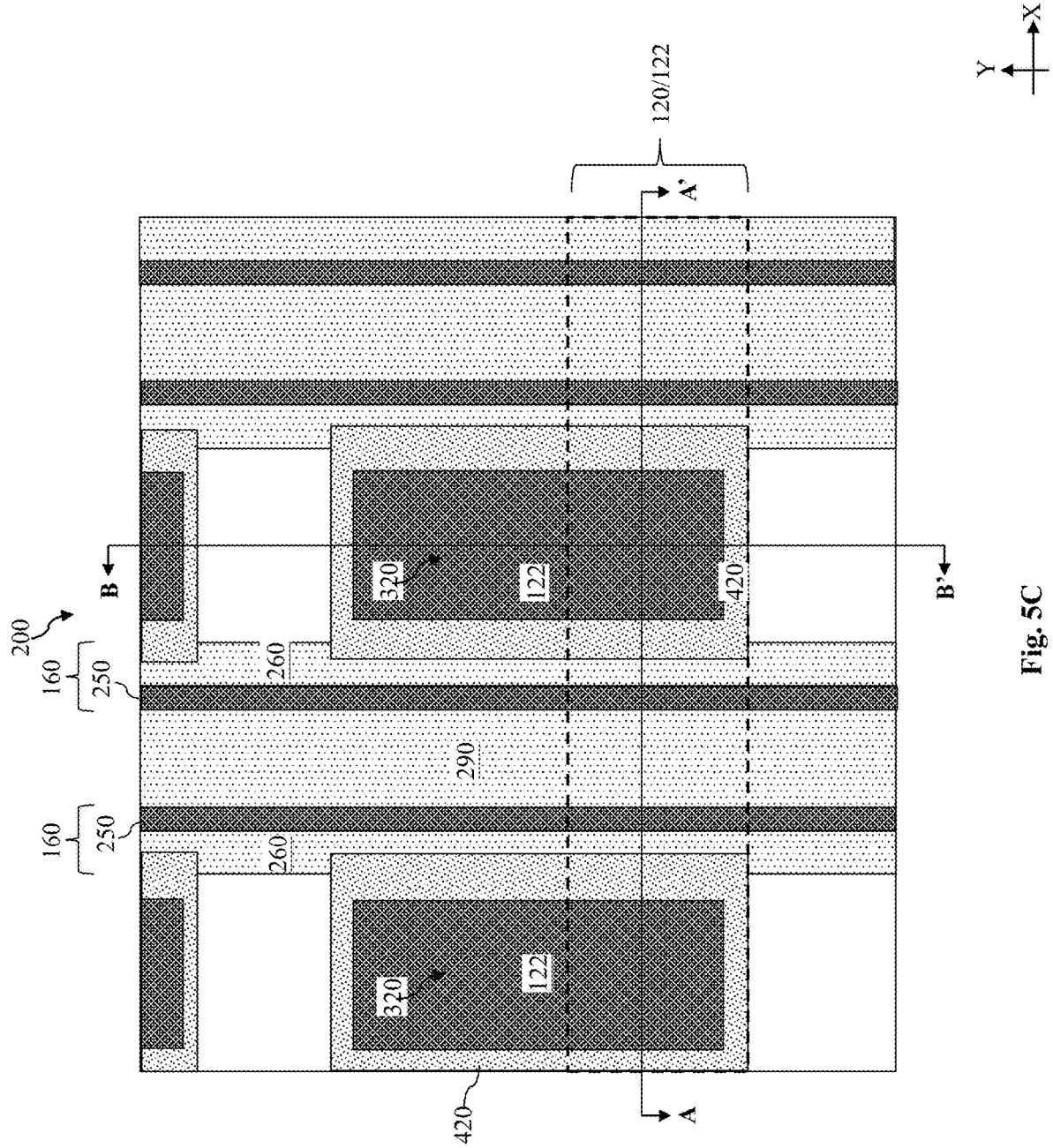

Referring now to FIGS. 5A-5C, an etching process 450 is performed to the IC device 200 to remove portions of the ILD 185 until the source/drain components 122 are exposed. In some embodiments, the etching process 450 includes a wet etching process. The etching process 450 is performed with an etching selectivity between the protective liners 420 and the ILD 185. For example, the etching process 450 may be configured to have a substantially greater etching rate with respect to the ILD 185 than the protective liners 420. In this manner, the ILD 185 may be etched away without substantially removing the protective liners 420. However, as shown in FIGS. 5A and 5B, the etching process 450 may partially etch the source/drain components 122. The photoresist layer 310 may also be removed either before or after the etching process 450, for example, by a photoresist stripping or an ashing process.

Figure 6C:
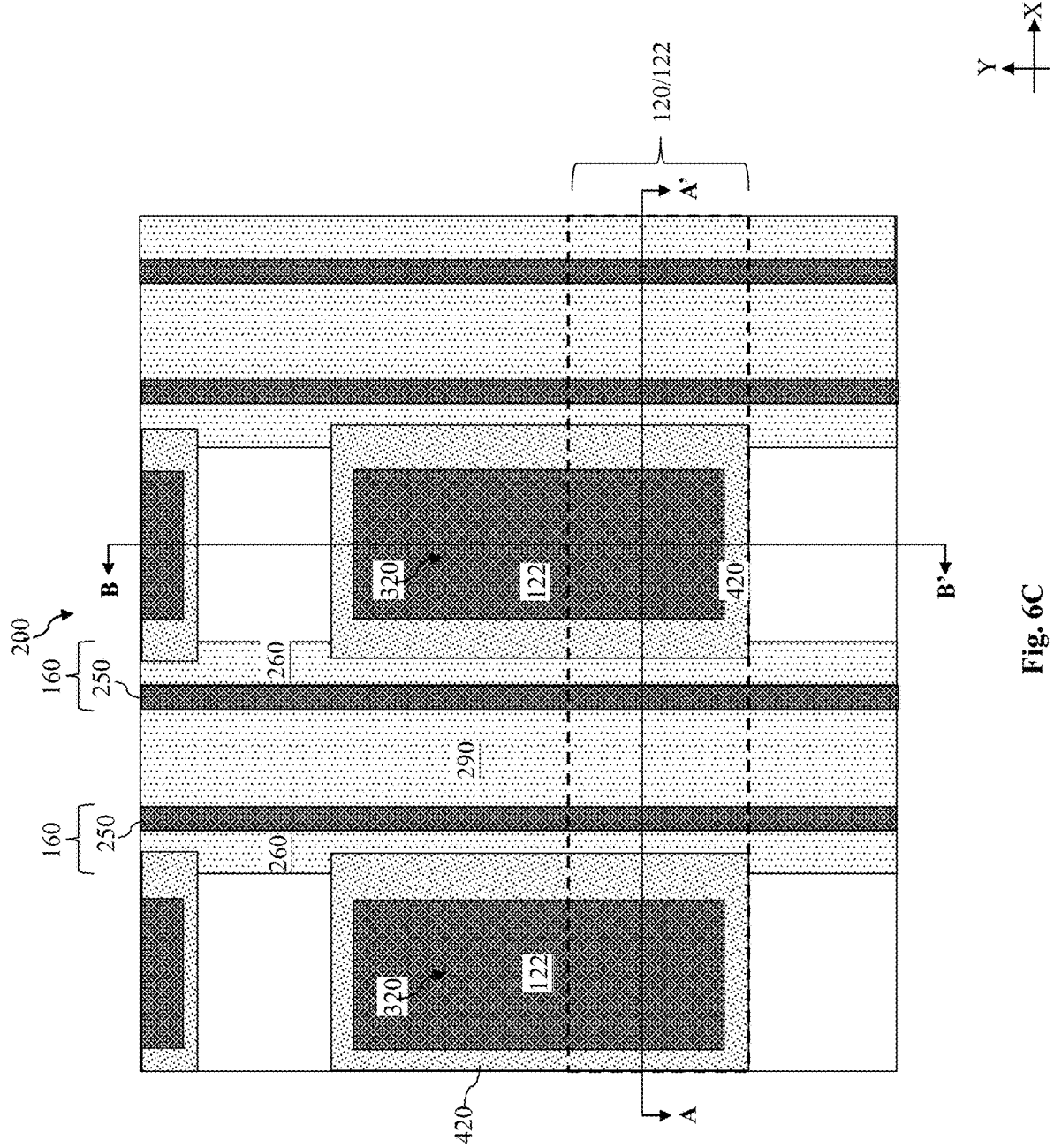

Referring now to FIGS. 6A-6C, an etching process 500 is performed to the IC device 200 to further etch the ILD 185. In some embodiments, the etching process 500 is a wet etching process, which is configured to have an etching selectivity between the ILD 185 and the protective liners 420. For example, the etching process 500 is configured to etch away the ILD 185 (e.g., containing silicon oxide) at a substantially faster rate than the protective liners 420 (e.g., containing silicon nitride). The etching process 500 completely removes the remaining portions of the ILD 185 covering the source/drain components 122 in the X-Z cross-sectional view of FIG. 6A, while the protective liners 420 are substantially left intact. As a result, the removal of the ILD 185 completely exposes the upper surface 470 of each of the source/drain components 122. Meanwhile, the protective liners 420 protect the portions of the ILD 185 (on which the protective liners 420 are disposed) from being etched. This leads to a lateral expansion (in the Y-direction) of a bottom portion 320A of each of the openings 320. As shown in FIG. 6B, the bottom portion 320A protrudes farther out in the Y-direction than a rest of the opening 320, and the sidewalls of the bottom portion 320A each has a slanted or sloped profile. Such a profile is unique to the present disclosure, since conventional fabrication processes would not have formed the protective liners 420 that are disposed on just the upper part of the sidewalls of the ILD 185 within the openings 320. As such, conventional IC devices would lack the lateral protrusion of the bottom portion 320A of the opening 320.

Figure 7C:
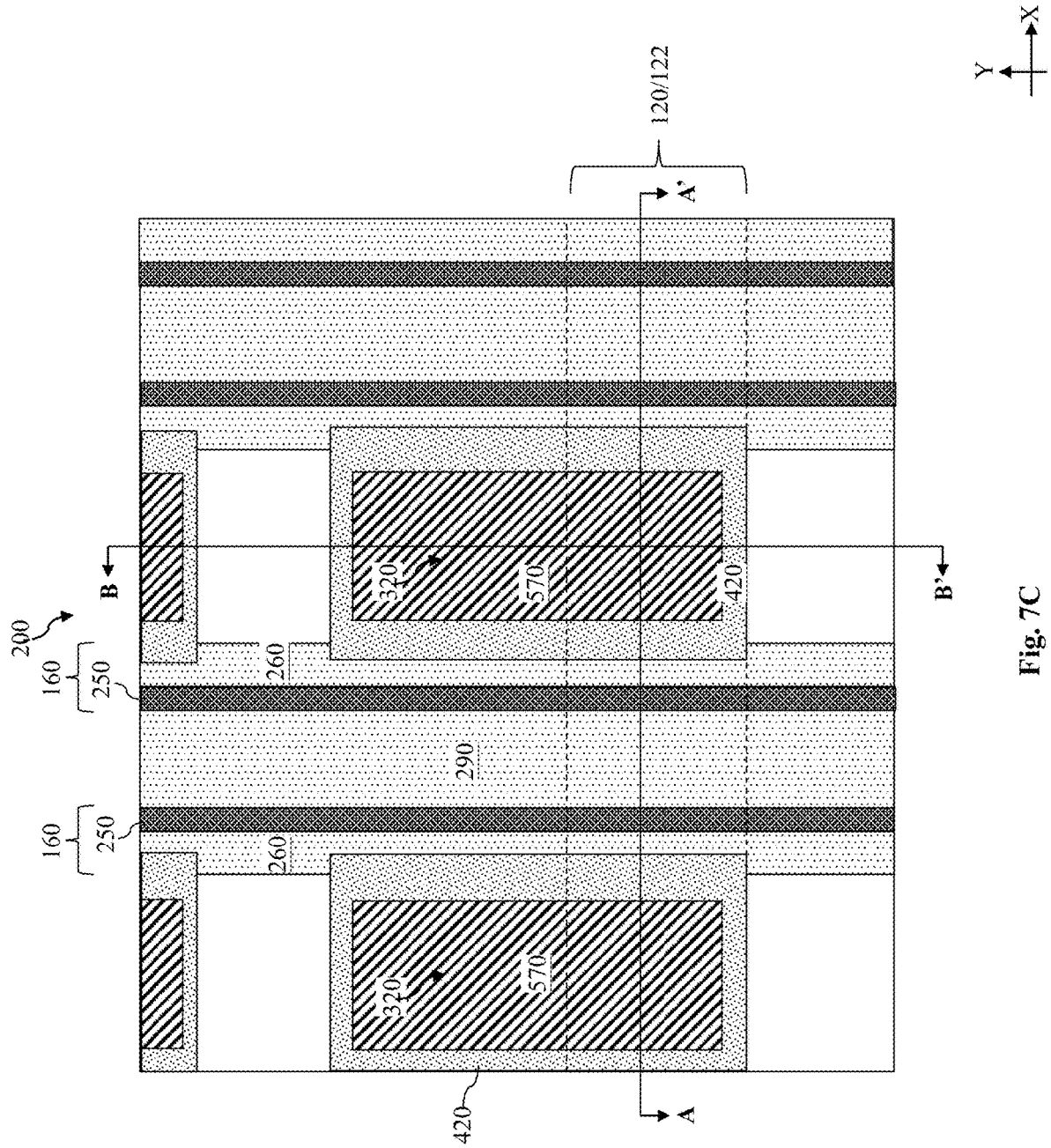

Referring now to FIGS. 7A-7C, a source/drain contact formation process 550 is performed to the IC device 200 to form source/drain contacts 570 in the openings 320 and over the source/drain components 122. The source/drain contact formation process 550 may include a deposition process to deposit a conductive material over the source/drain components 122 and to fill the openings 320. In some embodiments, the deposition process may include CVD, PVD, ALD, or combinations thereof, and the deposited conductive material may include cobalt. In other embodiments, different types of metal materials may be deposited into the openings 320, such as aluminum, copper, tungsten, ruthenium, or alloys thereof. Following the deposition process, the source/drain contact formation process 550 may also include a planarization process, such as a CMP process, to planarize the upper surfaces of the deposited conductive material with the upper surfaces of the ILD 185. The resulting structure in the openings 320 are the source/drain contacts.

It is understood that in some embodiments, a metal silicide (e.g., titanium silicide) may first be formed on the upper surfaces of each of the source/drain components, so as to enhance electrical conductivity (or to reduce electrical resistance). For example, a small amount of metal (e.g., titanium) may be deposited on the upper surfaces of the source/drain components 122, and then an annealing process may be performed at a high temperature to cause the metal material to react with the silicon material of the source/drain components in order to form a thin layer of metal silicide at the upper surfaces of the source/drain components 122. The deposition process (e.g., in which a metal such as cobalt is deposited) of the source/drain contact formation process 550 may then be performed, so that the deposited conductive material (e.g., cobalt) is formed on the metal silicides. For reasons of simplicity, the metal silicides are not specifically illustrated herein. Nevertheless, it is understood that the metal silicides may still be considered a part of the source/drain contacts 570.

As discussed above, due to the novel fabrication process flow performed in the present disclosure (e.g., forming the protective liners 420 partially on the sidewalls of the openings 320), the source/drain contacts 570 have various unique physical characteristics, which makes IC devices fabricated according to the present disclosure easy to identify, for example using various reverse engineering techniques (e.g., Transmission Electron Microscopy (TEM) images or Scanning Electron Microscope (SEM) images).

One of the unique physical characteristics is that a substantial majority of the upper surface 470 of each source/drain component 122 may be in direct physical contact with the source/drain contacts 570 (which may include metal silicides) formed thereover. In some embodiments, 100% of the upper surface 470 of each source/drain component 122 is in direct physical contact with the source/drain contacts 570 formed thereover. This is made possible because the protective liners 420 are formed before the openings 320 are extended vertically completely through the ILD 185 to expose the upper surface 470 of the source/drain component 122. As a result, the bottommost tip or bottommost surface of the protective liners 420 is substantially more elevated vertically in the Z-direction than the upper surface 470 of the source/drain component 122, meaning there is no reasonable likelihood that the protective liners 420 will come into direct physical contact with the upper surface 470 of the source/drain component 122. Accordingly, 100% of the upper surface 470 of the source/drain component 122 may be available as the "landing" area for the source/drain contacts 570, rather than needlessly sacrificing a portion of the upper surface 470 to be occupied by the protective liners 420. In this manner, the increased landing area for the source/drain contacts 570 may lead to a reduction in their electrical resistance, thereby improving device performance.

Another unique characteristic of the source/drain contact 570 is that it has a lateral protrusion or expansion at the bottom. In more detail, as shown in the Y-cut cross-sectional view of FIG. 7B, the source/drain contact 570 may be viewed as having a bottom portion 570A (which is the portion that is in direct physical contact with the upper surface 470 of the source/drain component 122) and a top portion 570B that is located above the bottom portion 560A in the Z-direction. The top portion 570B has sidewalls that are somewhat straight or linear, and its width (lateral dimension measured in the Y-direction) does not vary considerably (e.g., less than about 30%) as a function of its depth. In comparison, the bottom portion 570A of the source/drain contact 570 protrudes farther out in the Y-direction than the top portion 570B. For example, the bottom portion 570A has a side surface 580 that protrudes beyond (in the Y-direction) the bottom tip of the side surface 590 of the top portion 570B. In some embodiments, an outermost point of the side surface 580 of the bottom portion 570A is located farther out in the Y-direction than the outermost point of the side surface 590 of the top portion. Alternatively stated, a maximum width of the bottom portion 570A exceeds a maximum width of the top portion 570B in the Y-direction. In addition, the side surface 580 has a slanted or sloped profile (e.g., sloping outwards in the Y-direction) in the Y-cut cross-sectional view of FIG. 7B. In the embodiment shown, the side surface 580 of the bottom portion 570A may also be curved or rounded, whereas the side surface 590 of the top portion 570B may be more linear or straight compared to the side surface 580. Again, since the bottom tip of the protective liner 420 terminates before reaching the bottom portion 570A of the source/drain contact 570, the protective liner 420 will not reduce the interface area between the source/drain contact 570 and the source/drain component 122.

Referring now to FIGS. 8A-8C, a dielectric layer 600 is formed over the planarized upper surfaces of the ILD 185 and the source/drain contacts 570. In some embodiments, the dielectric layer 600 includes silicon nitride. An ILD 610 is then formed over the dielectric layer 600. In some embodiments, the ILD 610 includes silicon oxide, or have a material composition similar to the ILD 185. The ILD 610 may also be referred to as an ILD-1 layer. Thereafter, a plurality of gate contacts 650 and source/drain vias 660 may be formed. The formation of the gate contacts 650 and the source/drain vias 660 may include a patterning process to etch a gate contact opening above the gate structure 140, as well as source/drain via openings above the source/drain contacts 570. The gate contact opening extends vertically through portions of the ILD 610, the dielectric layer 600, and the mask layer 290 above the gate structure 140. The source/drain via opening extends vertically through portions of the ILD 610 and the dielectric layer 600 above the source/drain contacts 570. The gate contact opening and the source/drain via opening are then filled with one or more conductive materials (e.g., cobalt, tungsten, ruthenium, copper, aluminum, or combinations thereof) to form the gate contact 650 in the gate contact opening and the source/drain via 660 in the source/drain via opening. The gate contact 650 provides electrical connectivity to the gate structure 140, and the source/drain via 660 provides electrical connectivity to the source/drain components 122 through the source/drain contacts 570.

As discussed above, as semiconductor device fabrication progresses to smaller technology nodes, locational drifts of various IC components may raise the risks of electrical bridging. For example, had the protective liners 420 not been formed, as the gate contact opening is etched into place, a slight lateral drift in the location of the gate contact opening toward a nearby source/drain contact 570 may cause the gate contact opening to inadvertently expose a portion of the nearby source/drain contact 570. When this occurs, the gate contact 650 formed by the conductive material filling the gate contact opening may physically touch the source/drain contact 570, which causes undesirable electrical shorting between the gate contact 650 and the source/drain contact 570. Here, the presence of the protective liners 420 prevents the gate contact opening from exposing the source/drain contact 570 during the etching of the gate contact opening, since the protective liners 420 have a much slower etching rate than the mask layer 290 during the gate contact opening etching process. In other words, the gate contact opening can be etched into place through the mask layer 290 without damaging the protective liners 420, even if the location of the gate contact opening is shifted laterally in the X-direction, especially since the protective liners 420 have a depth that is deeper than the depth of the gate contact opening in the Z-direction. Consequently, the protective liners 420 can sufficiently protective the electrical bridging between the gate contact 650 and the source/drain contact 570.

Note that in the top view of FIG. 8C, the outlines or contours of the gate structures 140 are illustrated using dashed lines, even though the gate structures 140 are not directly visible in the top view at this stage of fabrication.

Figure 9:
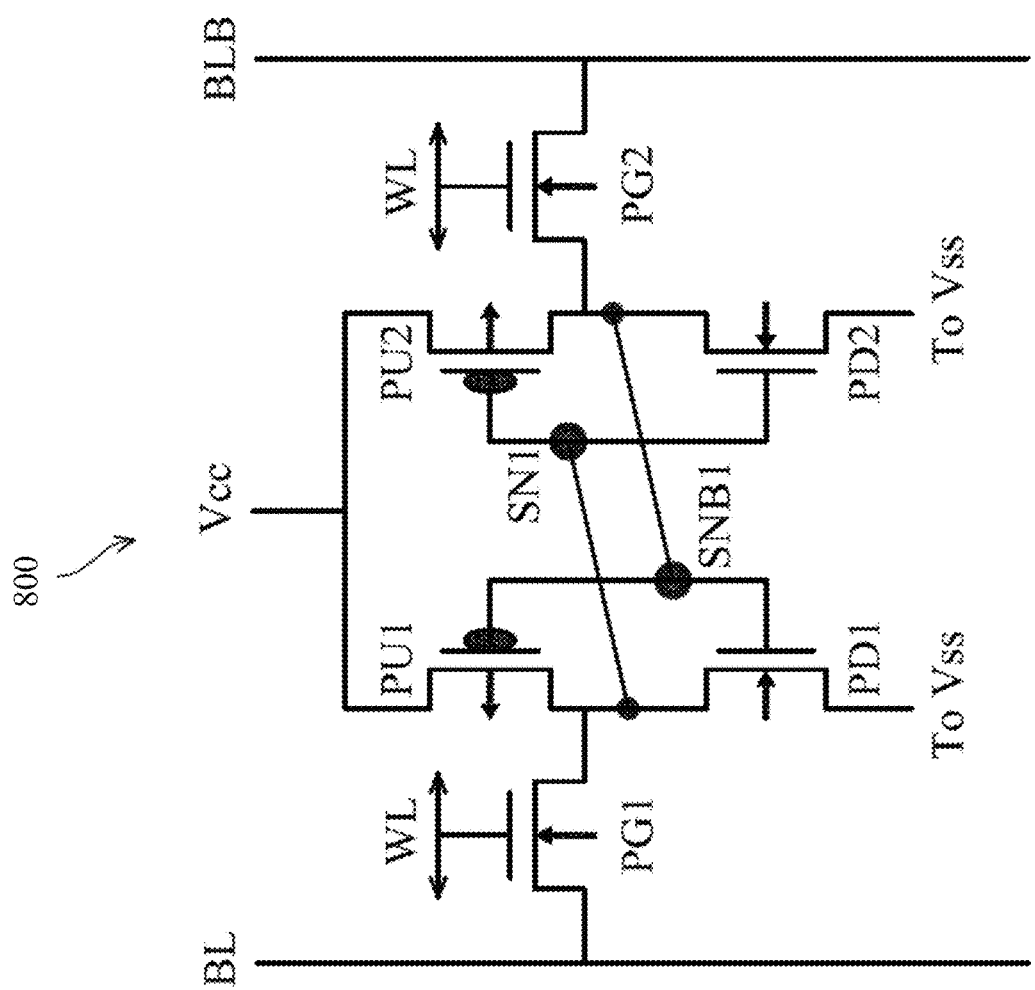
FIG. 9 is a circuit schematic of an SRAM cell according to various aspects of the present disclosure.

The IC device 200 may be implemented in a variety of IC applications, including memory devices such as Static Random-Access Memory (SRAM) devices. In that regard, FIG. 9 illustrates an example circuit schematic for a single-port SRAM cell (e.g., 1-bit SRAM cell) 800. The single-port SRAM cell 800 includes pull-up transistors PU1, PU2; pull-down transistors PD1, PD2; and pass-gate transistors PG1, PG2. As show in the circuit diagram, transistors PU1 and PU2 are p-type transistors, and transistors PG1, PG2, PD1, and PD2 are n-type transistors. According to the various aspects of the present disclosure, the PG1, PG2, PD1, and PD2 transistors are implemented with thinner spacers than the PU1 and PU2 transistors. Since the SRAM cell 800 includes six transistors in the illustrated embodiment, it may also be referred to as a 6T SRAM cell.

The drains of pull-up transistor PU1 and pull-down transistor PD1 are coupled together, and the drains of pull-up transistor PU2 and pull-down transistor PD2 are coupled together. Transistors PU1 and PD1 are cross-coupled with transistors PU2 and PD2 to form a first data latch. The gates of transistors PU2 and PD2 are coupled together and to the drains of transistors PU1 and PD1 to form a first storage node SN1, and the gates of transistors PU1 and PD1 are coupled together and to the drains of transistors PU2 and PD2 to form a complementary first storage node SNB1. Sources of the pull-up transistors PU1 and PU2 are coupled to power voltage Vcc (also referred to as Vdd), and the sources of the pull-down transistors PD1 and PD2 are coupled to a voltage Vss, which may be an electrical ground in some embodiments.

The first storage node SN1 of the first data latch is coupled to bit line BL through pass-gate transistor PG1, and the complementary first storage node SNB1 is coupled to complementary bit line BLB through pass-gate transistor PG2. The first storage node N1 and the complementary first storage node SNB1 are complementary nodes that are often at opposite logic levels (logic high or logic low). Gates of pass-gate transistors PG1 and PG2 are coupled to a word line WL. SRAM devices such as the SRAM cell 800 may be implemented using "planar" transistor devices, with FinFET devices, and/or with GAA devices.

Figure 10:
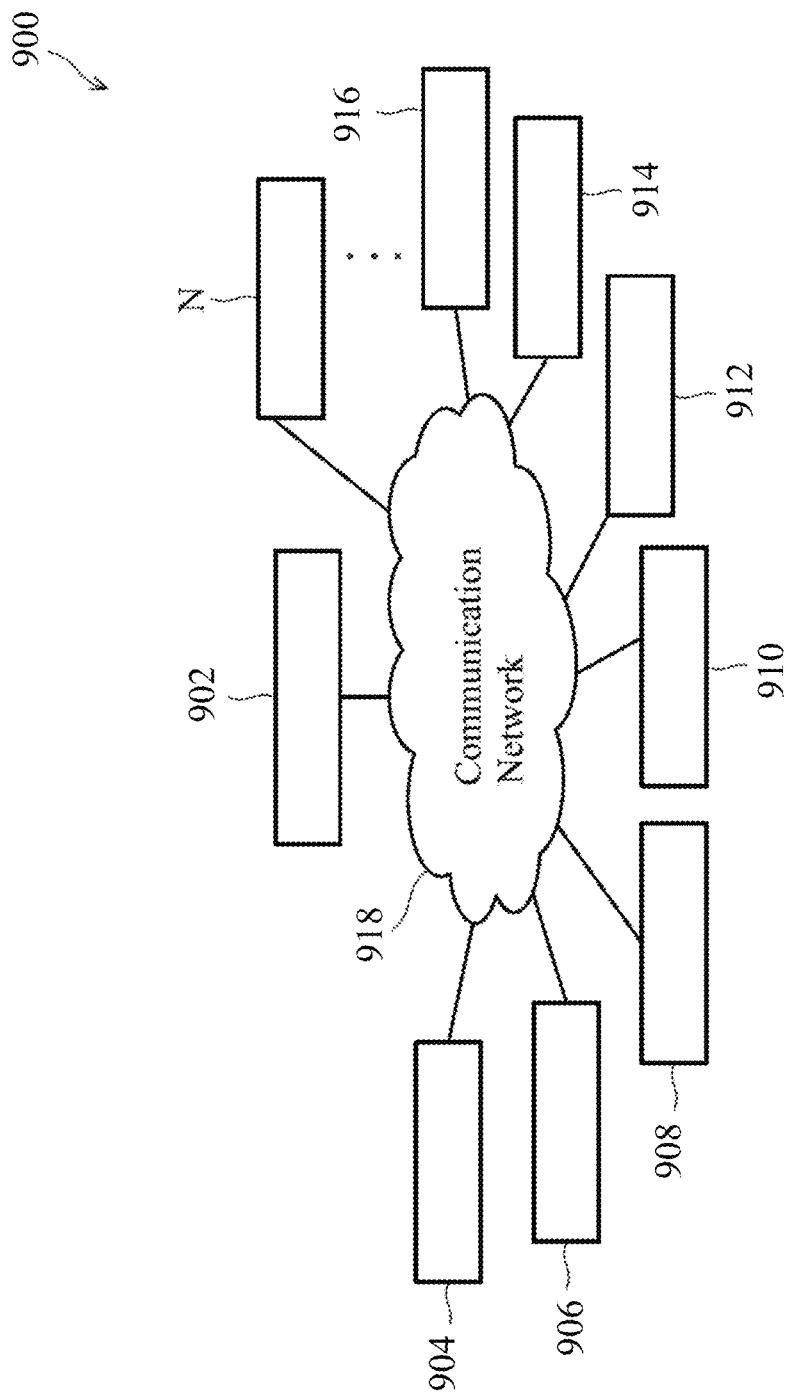
FIG. 10 is a block diagram of a manufacturing system according to various aspects of the present disclosure.

FIG. 10 illustrates an integrated circuit fabrication system 900 according to embodiments of the present disclosure. The fabrication system 900 includes a plurality of entities 902, 904, 906, 908, 910, 912, 914, 916 ..., N that are connected by a communications network 918. The network 918 may be a single network or may be a variety of different networks, such as an intranet and the Internet, and may include both wire line and wireless communication channels.

In an embodiment, the entity 902 represents a service system for manufacturing collaboration; the entity 904 represents an user, such as product engineer monitoring the interested products; the entity 906 represents an engineer, such as a processing engineer to control process and the relevant recipes, or an equipment engineer to monitor or tune the conditions and setting of the processing tools; the entity 908 represents a metrology tool for IC testing and measurement; the entity 910 represents a semiconductor processing tool, such an EUV tool that is used to perform lithography processes to define the gate spacers of an SRAM device; the entity 912 represents a virtual metrology module associated with the processing tool 910; the entity 914 represents an advanced processing control module associated with the processing tool 910 and additionally other processing tools; and the entity 916 represents a sampling module associated with the processing tool 910.

Each entity may interact with other entities and may provide integrated circuit fabrication, processing control, and/or calculating capability to and/or receive such capabilities from the other entities. Each entity may also include one or more computer systems for performing calculations and carrying out automations. For example, the advanced processing control module of the entity 914 may include a plurality of computer hardware having software instructions encoded therein. The computer hardware may include hard drives, flash drives, CD-ROMs, RAM memory, display devices (e.g., monitors), input/output device (e.g., mouse and keyboard). The software instructions may be written in any suitable programming language and may be designed to carry out specific tasks.

The integrated circuit fabrication system 900 enables interaction among the entities for the purpose of integrated circuit (IC) manufacturing, as well as the advanced processing control of the IC manufacturing. In an embodiment, the advanced processing control includes adjusting the processing conditions, settings, and/or recipes of one processing tool applicable to the relevant wafers according to the metrology results.

In another embodiment, the metrology results are measured from a subset of processed wafers according to an optimal sampling rate determined based on the process quality and/or product quality. In yet another embodiment, the metrology results are measured from chosen fields and points of the subset of processed wafers according to an optimal sampling field/point determined based on various characteristics of the process quality and/or product quality.

One of the capabilities provided by the IC fabrication system 900 may enable collaboration and information access in such areas as design, engineering, and processing, metrology, and advanced processing control. Another capability provided by the IC fabrication system 900 may integrate systems between facilities, such as between the metrology tool and the processing tool. Such integration enables facilities to coordinate their activities. For example, integrating the metrology tool and the processing tool may enable manufacturing information to be incorporated more efficiently into the fabrication process or the APC module, and may enable wafer data from the online or in site measurement with the metrology tool integrated in the associated processing tool.

Figure 11:
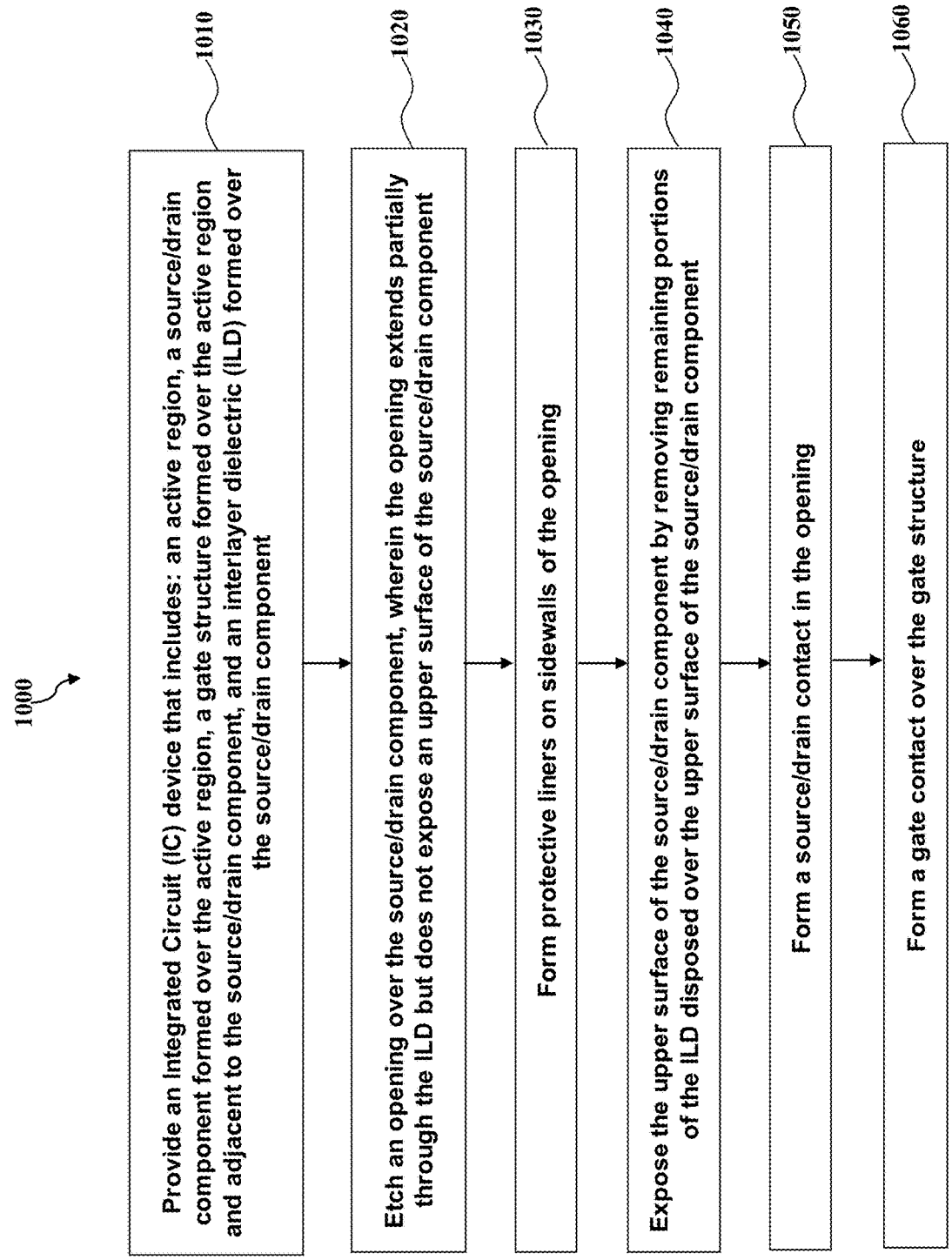
FIG. 11 is a flowchart illustrating a method of fabricating a semiconductor device according to various aspects of the present disclosure.

FIG. 11 is a flowchart illustrating a method 1000 of fabricating a semiconductor device according to embodiments of the present disclosure. The method 1000 includes a step 1010 to provide an Integrated Circuit (IC) device that includes: an active region, a source/drain component formed over the active region, a gate structure formed over the active region and adjacent to the source/drain component, and an interlayer dielectric (ILD) formed over the source/drain component.

The method 1000 includes a step 1020 to etch an opening over the source/drain component. The opening extends partially through the ILD but does not expose an upper surface of the source/drain component.

The method 1000 includes a step 1030 to form protective liners on sidewalls of the opening.

The method 1000 includes a step 1040 to expose the upper surface of the source/drain component by removing remaining portions of the ILD disposed over the upper surface of the source/drain component.

The method 1000 includes a step 1050 to form a source/drain contact in the opening.

The method 1000 includes a step 1060 to form a gate contact over the gate structure.

In some embodiments, the step 1020 etches the opening to have a depth that extends deeper than an upper surface of the gate structure.

In some embodiments, the step 1030 performs a plurality of cycles that each include a deposition process that deposits a dielectric material and an etching process that etches the deposited dielectric material. In some embodiments, the deposition process deposits the dielectric material having a different material composition than the ILD.

In some embodiments, the step 1040 completely exposes the upper surface of the source/drain component. In some embodiments, the step 1050 forms the source/drain contact on an entire upper surface of the source/drain component.

In some embodiments, the step 1040 is performed with an etching process having an etching selectivity between the protective liners and the ILD, such that the ILD is etched without substantially affecting the protective liners.

In some embodiments, the step 1040 comprises performing a first etching process to vertically extend the opening through the ILD until the upper surface of the source/drain component is exposed, and then performing a second etching process to laterally expand a bottom portion of the opening.

It is understood that the method 1000 may include further steps performed before, during, or after the steps 1010-1060. For example, the method 1000 may include steps of forming dummy gate structures, forming additional metallization layers, packaging processes, testing processes, etc. For reasons of simplicity, these additional steps are not discussed herein in detail.

The advanced lithography process, method, and materials described above can be used in many applications, including fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure. It is also understood that the various aspects of the present disclosure discussed above may apply to multi-channel devices such as Gate-All-Around (GAA) devices. To the extent that the present disclosure refers to a fin structure or FinFET devices, such discussions may apply equally to the GAA devices.

In summary, the present disclosure forms protective liners that are located on the upper portion of the side surfaces of the source/drain contact, but not on the lower portion of the side surfaces of the source/drain contact. This is achieved by performing an etching process to etch a source/drain contact opening that extends partially through an ILD, where the source/drain contact opening is aligned with, but does not expose, the source/drain component located underneath. The protective liners are formed on the side surfaces of the source/drain contact opening. Thereafter, the source/drain contact opening is extended vertically downward to expose the source/drain component, and then a conductive material is formed to fill the source/drain contact opening to form the source/drain contact.

The present disclosure may offer advantages over conventional devices. However, it is understood that not all advantages are discussed herein, different embodiments may offer different advantages, and that no particular advantage is required for any embodiment. One advantage is that electrical resistance can be reduced. For example, the process sequence in which the protective liners and the source/drain contacts are formed ensures that the source/drain contact can be formed to "land" on an entirety of the upper surface of the source/drain component without the protective liner taking up a part of the source/drain contact "landing" area. The greater interface area between the source/drain contact and the source/drain component leads to a reduction in electrical resistance associated with the source/drain contact, since resistance is inversely related to interface area. Another advantage is that the protective liners can prevent or mitigate undesirable electrical shorting between the source/drain contact and a nearby gate contact. In more detail, as semiconductor feature sizes continue to shrink with each technology generation, a locational shift of the components, such as gate contacts with respect to the source/drain contacts, could result in undesirable electrical bridging or shorting between these components. Here, the protective liners help prevent the gate contact opening from puncturing a path that could lead to a direct physical contact between the gate contact and the source/drain contact. In other words, as the gate contact openings are being etched, even if the location of the gate contact opening is laterally shifted in a direction toward the source/drain contact, the presence of the protective liners will still be able to stop the gate contact opening from being etched to reach the source/drain contact. As such, the conductive material filling the gate contact opening (e.g., forming the gate contact) will still be prevented from reaching the source/drain contact. Consequently, the protective liners can reduce the risk of electrical bridging between the gate contact and the source/drain contact. Other advantages may include compatibility with existing fabrication processes (including for both FinFET and GAA processes) and the ease and low cost of implementation.

One aspect of the present disclosure pertains to a device. The device includes one or more active region structures that each protrude vertically out of a substrate in a vertical direction and extend horizontally in a first horizontal direction. The device includes a source/drain component disposed over the one or more active region structures in the vertical direction. The device includes a source/drain contact disposed over the source/drain component in the vertical direction, wherein the source/drain contact includes a bottom portion and a top portion. The device includes a protective liner disposed on side surfaces of the top portion of the source/drain contact but not on side surfaces of the bottom portion of the source/drain contact.

Another aspect of the present disclosure pertains to a device. The device includes one or more fin structures that each protrude vertically out of a substrate in a vertical direction and extend horizontally in a first horizontal direction. The device includes an epitaxial source/drain disposed over the one or more fin structures in the vertical direction. The device includes a source/drain contact disposed over the epitaxial source/drain in the vertical direction. The source/drain contact includes an upper segment and a lower segment. In a cross-sectional view defined by the vertical direction and a second horizontal direction perpendicular to the first horizontal direction, the lower segment has a slanted profile and has a greater maximum width than the upper segment.

Yet another aspect of the present disclosure pertains to a method. An Integrated Circuit (IC) device is provided that includes: an active region, a source/drain component formed over the active region, a gate structure formed over the active region and adjacent to the source/drain component, and an interlayer dielectric (ILD) formed over the source/drain component. An opening is etched over the source/drain component. The opening extends partially through the ILD but does not expose an upper surface of the source/drain component. Protective liners are formed on sidewalls of the opening. The upper surface of the source/drain component is exposed by removing remaining portions of the ILD disposed over the upper surface of the source/drain component. A source/drain contact is formed in the opening. A gate contact is formed over the gate structure.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a source/drain component;
   a source/drain contact disposed over the source/drain component;
   a first segment of a liner disposed on an upper portion, but not an entirety, of a lateral segment of a first sidewall of the source/drain contact in a cross-sectional side view; and
   a second segment of the liner disposed on an upper portion, but not an entirety, of a lateral segment of a second sidewall of the source/drain contact in the cross-sectional side view, the second sidewall being opposite the first sidewall;
   wherein at least one of the first segment or the second segment of the liner has a greater width at a higher vertical location than at a lower vertical location.

2. The device of claim 1, wherein:
   the cross-sectional side view is a first cross-sectional side view taken in a first plane defined by a vertical direction and a first horizontal direction; and
   the liner is further disposed on a portion, but not an entirety, of the first or second sidewall of the source/drain contact in a second cross-sectional side view taken in a second plane defined by the vertical direction and a second horizontal direction perpendicular to the first horizontal direction.

3. The device of claim 2, wherein the source/drain contact has different profiles in the first cross-sectional side view and the second cross-sectional side view.

4. The device of claim 2, wherein:
   the liner is disposed on a first portion of the sidewall of the source/drain contact but not on a second portion of the sidewall of the source/drain contact; and
   the second portion of the sidewall has a substantially straight profile in the first cross-sectional side view and a curved profile in the second cross-sectional side view.

5. The device of claim 4, wherein an outermost lateral protrusion of the second portion of the sidewall protrudes laterally past a bottommost tip of the liner in the second cross-sectional side view.

6. The device of claim 1, further comprising a gate spacer disposed besides the liner, wherein the liner and the gate spacer have different material compositions.

7. The device of claim 1, wherein a bottom surface of the source/drain contact is in physical contact with an entirety of an upper surface of the source/drain component.

8. The device of claim 7, wherein the upper surface of the source/drain component is substantially flat.

9. The device of claim 1, further comprising:
   a dielectric layer disposed over the liner and over the source/drain contact; and
   an interlayer dielectric (ILD) disposed over the dielectric layer, wherein the ILD and the dielectric layer have different material compositions, and wherein the ILD and the liner have different material compositions.

10. A device, comprising:
    a first active region and a second active region that each protrude vertically out of a substrate in a vertical direction, wherein the first active region and the second active region are spaced apart in a first horizontal direction;
    a source/drain component that wraps around an upper surface and portions of side surfaces of the first active region and the second active region;
    a source/drain contact disposed over the source/drain component, wherein at least a lower segment of a side surface of a first portion of the source/drain contact is curved, and wherein the first portion of the source/drain contact has a same material composition as a rest of the source/drain contact; and
    a liner disposed on an upper segment of the side surface of the first portion of the source/drain contact, but not on the lower segment of the side surface of the first portion of the source/drain contact, wherein an outermost lateral protrusion of the lower segment of the side surface of the first portion of the source/drain contact protrudes laterally beyond a bottommost segment of the liner.

11. The device of claim 10, wherein:
    the upper segment of the side surface of the first portion of the source/drain contact is more linear than the lower segment of the side surface of the first portion of the source/drain contact.

12. The device of claim 11, wherein the lower segment is curved in a first cross-sectional side view defined by the vertical direction and the first horizontal direction, but is substantially straight in a second cross-sectional side view defined by the vertical direction and a second horizontal direction different from the first horizontal direction.

13. The device of claim 11, wherein a horizontal dimension of the liner varies as a function of a depth of the liner.

14. The device of claim 10, wherein:
    the source/drain component includes a substantially flat upwardly-facing surface; and
    an entirety of the substantially flat upwardly-facing surface is in direct contact with the source/drain contact.

15. A method, comprising:
    forming an opening that extends vertically partially through an interlayer dielectric (ILD) that has a single layer material, wherein the opening is aligned with, but does not expose, a source/drain region of a transistor;
    forming a liner on a side surface of the opening, wherein the liner is formed through a plurality of deposition and etching cycles, wherein each cycle includes a deposition process and an etching process;
    vertically extending the opening through the ILD, such that at least a portion of the source/drain region is exposed by the opening; and
    filling the opening with a source/drain contact.

16. The method of claim 15, wherein in each of the etching cycles, an etching selectivity exists between the ILD and the liner.

17. The method of claim 15, wherein the liner is formed to have a cross-sectional profile that is wider a top portion of the liner and narrower at a bottom portion of the liner.

18. The method of claim 15, further comprising: after the vertically extending but before the filling, performing an etching process that laterally expands a bottom portion of the opening.

19. The method of claim 18, wherein the etching process expands the bottom portion of the opening to have a greater lateral dimension than an upper surface of the source/drain region.

20. The method of claim 15, wherein a bottom surface of the opening is defined by a portion of the ILD.

* * * * *